(12) United States Patent
Sentoku

(10) Patent No.: US 7,396,620 B2
(45) Date of Patent: Jul. 8, 2008

(54) EXPOSURE METHOD AND EXPOSURE MANAGEMENT SYSTEM

(75) Inventor: Koichi Sentoku, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 823 days.

(21) Appl. No.: 10/928,982

(22) Filed: Aug. 27, 2004

(65) Prior Publication Data

US 2005/0084782 A1    Apr. 21, 2005

(30) Foreign Application Priority Data

Aug. 29, 2003  (JP)  ............................. 2003-306293
Mar. 25, 2004  (JP)  ............................. 2004-089539

(51) Int. Cl.
*G03C 5/00* (2006.01)

(52) U.S. Cl. ......................... 430/30; 430/311; 430/327; 430/330

(58) Field of Classification Search .................. 430/30, 430/311, 327, 330
See application file for complete search history.

(56) References Cited

U.S. PATENT DOCUMENTS 6,689,519 B2 *  2/2004  Brown et al. ................... 430/30

FOREIGN PATENT DOCUMENTS

| JP | 2001-102282 | 4/2001 |
| JP | 2002-031895 | 1/2002 |
| JP | 2003-168641 | 6/2003 |

OTHER PUBLICATIONS

Official Action from the Korean Patent Office issued on May 26, 2006 with translation.

* cited by examiner

*Primary Examiner*—Christopher G Young
(74) *Attorney, Agent, or Firm*—Morgan & Finnegan, LLP

(57) ABSTRACT

There is provided an exposure method for exposing a pattern on an original form onto an object through a projection optical system. The exposure method includes the steps of obtaining, for each piece of information of resist applied to a first object, a correlation among an exposure dose for exposing the first object, a focus state of the first object in the projection optical system, and a pattern shape formed on the first object exposed with the exposure dose and the focus state, acquiring information of resist applied to a second object different from the first object, determining an exposure dose for exposing the second object, and a focus state of the second object in the projection optical system, based on the correlation obtained by the obtaining step and the information of the resist applied to the second object acquired by the acquiring step, and transferring the pattern formed on the original form onto the second object in accordance with the exposure dose and focus state determined by the determining step.

10 Claims, 21 Drawing Sheets

| | | FOCUS (um) | EXPOSURE DOSE (Jm2) | LINE WIDTH c(nm) | HEIGHT h (nm) | SIDEWALL ANGLEs (deg.) |
|---|---|---|---|---|---|---|
| FIRST ROW | 1 | 0.05 | 380 | 97.2 | 210.0 | 79.7 |
| SECOND ROW | 2 | 0 | 380 | 104.2 | 244.1 | 82.5 |
| THIRD ROW | 3 | 0.05 | 380 | 109.7 | 257.8 | 85.3 |
| | 4 | 0.1 | 380 | 109.1 | 267.4 | 85.9 |
| | 5 | 0.15 | 380 | 106.2 | 267.0 | 88.1 |
| | 6 | -0.05 | 390 | 94.0 | 198.0 | 80.9 |
| | 7 | -0 | 390 | 105.7 | 237.9 | 82.6 |
| | 8 | 0.05 | 390 | 107.3 | 259.0 | 85.2 |
| | 9 | 0.1 | 390 | 106.8 | 261.6 | 86.8 |
| | 10 | 0.15 | 390 | 101.1 | 264.4 | 88.0 |

| 21 | -0.05 | 420 | 85.6 | 136.1 | 82.2 |
|---|---|---|---|---|---|
| 22 | 0 | 420 | 90.7 | 180.6 | 83.7 |
| 23 | 0.05 | 420 | 92.8 | 238.5 | 84.2 |
| 24 | 0.1 | 420 | 92.0 | 249.4 | 86.5 |
| 25 | 0.15 | 420 | 87.9 | 255.4 | 89.2 |

FIG. 4

X-AXIS: DIFFERENCE BETWEEN FOCUS VALUE CALCULATED POLYNOMIAL APPROXIMATION AND FOCUS VALUE FROM DATA FOR EVALUATION(nm)

Y-AXIS: NUMBERS OF DATA FOR ASSUMPTION

EXPOSURE METHOD AND EXPOSURE MANAGEMENT SYSTEM

BACKGROUND OF THE INVENTION

The present invention relates generally to an exposure method for exposing an object in the photolithography, such as a single crystal substrate and a spherical semiconductor for a semiconductor wafer, and a glass substrate for a liquid crystal display ("LCD"), and more particularly to a method for optimizing an exposure dose and focus in an exposure apparatus.

Recent demands on smaller and higher-performance electronic apparatuses have increasingly required finer processing and more precise (sectional) shaping of a circuit pattern for a semiconductor to be installed in the electronic apparatus. The lithography technology for manufacturing the semiconductor device has conventionally utilized a projection exposure apparatus that projects and transfers a circuit pattern, which is formed on a reticle (or a mask), onto a wafer, etc. through a projection optical system.

The minimum size or resolution to be transferred by the projection exposure apparatus is proportionate to the wavelength of light used for exposure, and inversely proportionate to the numerical aperture ("NA") of a projection optical system. Therefore, a method that attempts a high resolution uses a shorter wavelength of exposure light or increases the NA in the projection exposure apparatus.

The high resolution needs a proper exposure condition, when exposing a pattern on a reticle onto a substrate, such as a wafer onto which a photoresist (or a photosensitive agent, called "resist" hereinafter) is applied. The exposure condition includes various parameters, and particularly requires the exposure dose and focus to be appropriately set in order to transfer a fine pattern with a high resolution. The exposure dose in this specification is one parameter relating to the integral quantity of light irradiated upon a resist-applied wafer to be exposed. The focus is another parameter relating to whether or not a resist-applied wafer is placed on the best focus position at which a reticle pattern is imaged through a projection optical system in an exposure apparatus and, if not, how far the wafer is offset in the optical-axis direction in the projection optical system.

Again, the appropriately set exposure dose and focus are vital for the high resolution in the exposure apparatus. Accordingly, the exposure step sets the optimal exposure dose and the best focus for each processing or for each layer, and uses them for exposure. In addition, it is inspected whether a wafer is properly exposed with thus set exposure dose and focus, and the exposure dose and focus are corrected if necessary. See, for example, U.S. patent applications, Publication Nos. 2003/038250, 2003/106999, and 2003/121022.

A description will now be given of a method for setting the best exposure dose and the best focus, as disclosed in U.S. patent applications, Publication Nos. 2003/038250, 2003/106999, and 2003/121022, with reference to FIGS. 20 and 21. FIG. 20 is a flowchart for explaining a conventional method for setting the best exposure dose and focus. Referring to FIG. 20, a focus exposure matrix ("FEM") wafer is formed so as to set the best exposure dose and focus for a test (or condition determining) wafer (step 1002). Here, the FEM wafer is one that has a FEM pattern as an aggregate of plural shots onto which patterns have been exposed with different exposure doses and/or focuses, as shown in FIG. 21. The shot is one exposure unit. FIG. 21 is an enlarged sectional view that illustrates sectional shapes in the shots in the FEM pattern formed on the FEM wafer. The abscissa axis denotes the exposure doses, and the ordinate axis denotes the focuses. FIG. 21 graphically shows pattern's sectional shapes as a result of the development of the pattern that has been exposed with each exposure dose and focus.

Next, a shape measuring apparatus (not shown), such as an optical CD measurer or a SEM, measures the FEM pattern's sectional shape formed in each shot on the FEM wafer (step 1004), so as to determine the best exposure dose and focus that can provide an intended resist pattern shape (step 1006). For example, in FIG. 21, an exposure dose $E_0$ and a focus $F_0$ used to expose a thick-framed pattern are determined as the optimal exposure dose and the best focus because they can maintain broad margins.

Turning back to FIG. 20, acquired after the optimal exposure dose and the best focus are determined is a correlation among each FEM pattern's sectional shape and exposure dose and focus for each exposed FEM pattern (step 1008). The memory or the like stores the correlation data for use with step 1016, which will be described later, so as to inspect the optimal exposure dose and the best focus for the mass-produced wafer.

A circuit pattern or the like is exposed onto the mass-produced wafer with the optimal exposure dose and focus calculated by the step 1006 (step 1012). Next, the sectional shape of the pattern exposed on the mass-produced wafer in step 1012 is measured (step 1014), and compared with that corresponding to the optimal exposure dose and focus stored in step 1008. Next follows calculations of offset amounts (and directions) between the actual exposure dose and focus and the optimal exposure dose and focus calculated in step 1006 (step 1016). Then, it is determined whether the offset amounts from the optimal exposure dose and focus fall within predefined permissible ranges (step 1018). When the offset amounts from the optimal exposure dose and focus fall within predefined permissible ranges, the step 1012 and subsequent steps are repeated to expose the mass-produced wafer, whereas when the offset amounts from the optimal exposure dose and focus do not fall within predefined permissible ranges, the offset amounts are fed back to the exposure apparatus to reset the exposure dose and focus (step 1012) to expose the mass-produced wafer.

While the conventional method sets and corrects the optimal exposure dose and focus based on the correlation among the pattern's shape, the exposure dose and focus for the mass-produced wafers, even setting and correcting to the optimal exposure dose and focus can no longer provide intended pattern's shape as a finer processing is required.

One cause rests in a difference between a FEM pattern forming process for a test wafer and an actual pattern forming process for a mass-produced wafer. The difference between these two pattern forming processes can cause errors in calculating the offset amounts from the best focus and exposure dose in the exposure apparatus at the time of the mass production. The calculation is based on the deforming shape measuring marks on the mass-produced wafer, and shape information of the FEM pattern on the test wafer.

The conventional method determines conditions on the rough premise that when the same type of resist is used for both the test wafer and the mass-produced wafers, they have the common optimal exposure dose and focus conditions. No careful attentions have not been paid as to how the different forming processes affect the best exposure dose and focus conditions.

This is required from apparatus operators' demands on a longer operating period of time of an expensive semiconductor exposure apparatus. The longer operating time period inevitably limits the test time period. Thus, this demands have introduced an assumption that the test wafer and the mass-produced wafer have the common best exposure dose and focus when some common major parameters are used.

However, the processing of the exposed circuit pattern, which is required to be finer and finer, can no longer allow ignorance of a conventionally ignorable, slight difference in forming process between the test wafer and the mass-produced wafer.

Another cause of a deformed pattern irrespective of the best exposure dose and the best focus is an immature optimization in an approach for acquiring the relational equation that represents a relationship between the shape measuring pattern's shape arranged on each shot that forms the FEM pattern and the exposure conditions under which each shot is exposed.

BRIEF SUMMARY OF THE INVENTION

Accordingly, it is an exemplified object of the present invention to provide an exposure method that forms a fine pattern having a high-quality sectional shape, in which the above disadvantages are eliminated.

An exposure method of one aspect according to the present invention for exposing a pattern on an original form onto an object through a projection optical system includes the steps of obtaining, for each piece of information of resist applied to a first object, a correlation among an exposure dose for exposing the first object, a focus state of the first object in the projection optical system, and a pattern shape formed on the first object exposed with the exposure dose and the focus state, acquiring information of resist applied to a second object different from the first object, determining an exposure dose for exposing the second object, and a focus state of the second object in the projection optical system, based on the correlation obtained by the obtaining step and the information of the resist applied to the second object acquired by the acquiring step, and transferring the pattern formed on the original form onto the second object in accordance with the exposure dose and focus state determined by the determining step.

According to the present invention, an exposure method can be provided, which forms a fine pattern having a high-quality sectional shape.

BRIEF DESCRIPTION OF THE DRAWINGS

FIG. 4 is a view showing a relationship among the sectional shapes of the respective shots in the FEM pattern and the exposure doses and focuses used to expose the FEM pattern.

DETAILED DESCRIPTION OF THE PREFERRED EMBODIMENTS

Figure 1:
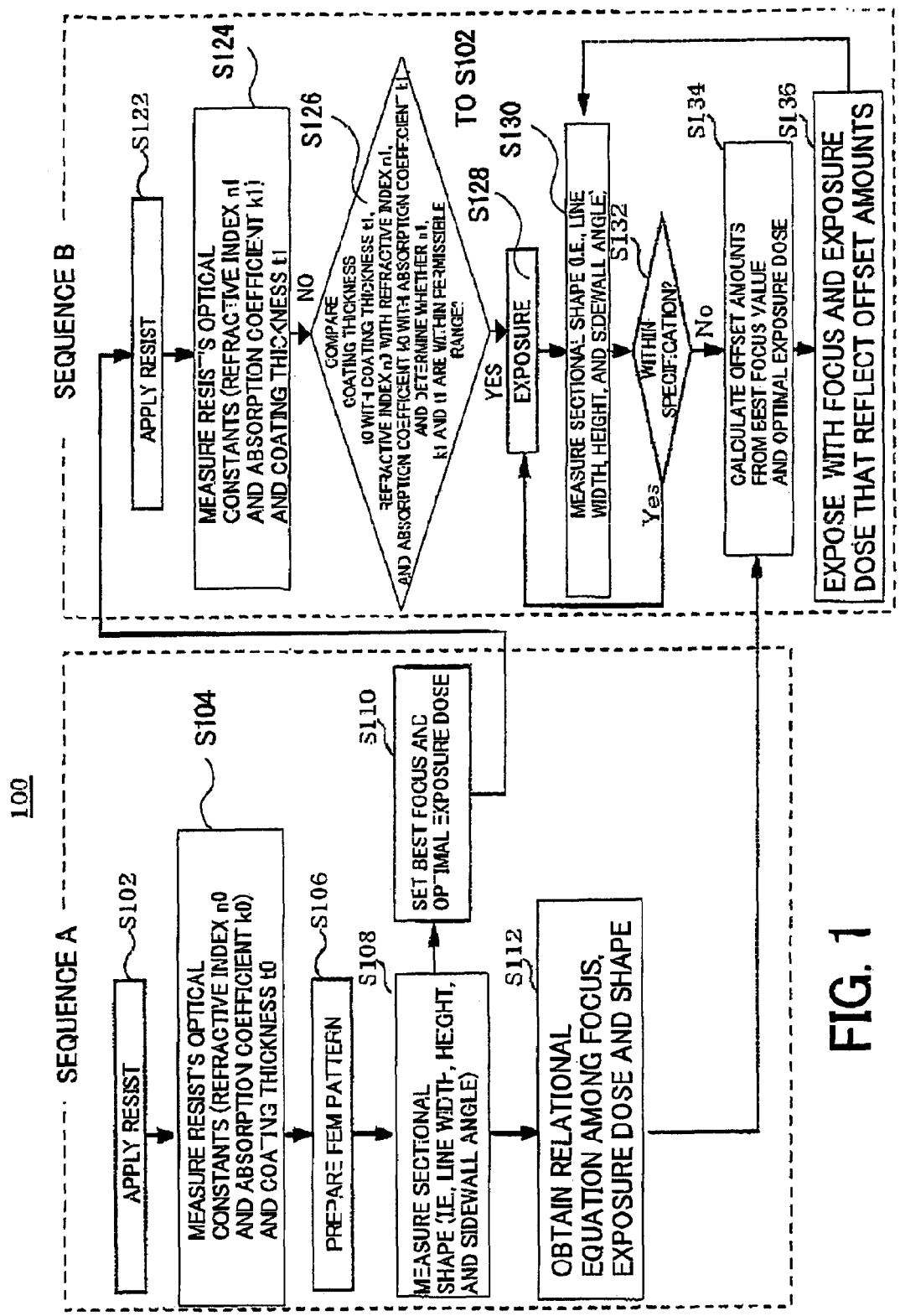
FIG. 1 is a flowchart for explaining an exposure method of a first embodiment.

The instant inventor has found that the resist's optical constants and coating thickness affect the pattern shape as a result of eager studies of the cause that setting and correcting to the optimal exposure dose and focus calculated from the test wafer can no longer provide an intended pattern shape in the mass-produced wafer. Here, the resist's optical constants include a refractive index and an absorption coefficient.

Since the conventional method for setting the optimal exposure dose and focus did not measure the resist's optical constants and/or coating thickness prior to the exposure, and thus cannot provide the same sectional shape between these two types of wafers, even though the common exposure dose and focus are used for exposures, if there are differences in resist's optical constants and/or coating thickness between the resist applied to the test wafer and the resist applied to the mass-produced wafer.

For example, the resist's optical constants can differ even when the product name is the same, according to resist's manufacture lots, aged deteriorations, etc. The resist's coating thickness can differ according to resist's viscosity, and coater's application conditions, etc.

Thus, when there are differences in resist's optical constants and/or coating thickness between the resist applied to the test wafer and the resist applied to the mass-produced wafer, the exposure distribution differs in the resist, the exposure dose and focus that have been obtained from the test resist are different from those in the mass-produced wafer, and thus a pattern having a desired sectional shape cannot be formed on the mass-produced wafer.

A shape measuring apparatus that utilizes scattered light or secondary electron beams from a wafer, such as an optical CD measurer and a SEM, are used to measure the pattern's sectional shape on the test and mass-produced wafers. Therefore, as discussed, a difference in resist's optical constant and/or coating thickness between the test wafer and the mass-produced wafer causes erroneous information about the spectral distribution and light intensity of the scattered light or erroneous information about the secondary electron beams. This erroneous information causes an inconsistent or inaccurate measurement result.

A description will now be given of various embodiments of the present invention specifically relating to an exposure method according to one aspect of the present invention, with reference to the accompanying drawings. The like elements in each figure are designated by the same reference numerals, and a duplicate description will be omitted.

A description will now be given of a first embodiment. Here, FIG. 1 is a flowchart for explaining an exposure method 100 of the first embodiment.

The exposure method of the instant embodiment forms a fine pattern with a high-quality sectional shape by controlling the optical constants (including the refractive index and/or the absorption coefficient) and/or coating thickness of the resist applied commonly to the test wafer and the mass-produced wafer. Referring to FIG. 1, the exposure method 100 includes two exposure flows, i.e., sequence A and sequence B: The sequence A includes the steps of preparing a FEM wafer (or a test wafer) on which a FEM pattern (which is a matrix pattern exposed on respective shots on one wafer, and depends upon the exposure parameters of the exposure dose and focus) has been exposed, setting the optimal exposure dose and focus using the FEM wafer, and correlating the exposure dose and focus with the FEM pattern shape using the multivariate analysis. The sequence B exposes the actual process wafer (or mass-produced wafer) based on a result of the multivariate analysis.

A description will be given of the sequence A that exposes the FEM pattern onto the FEM wafer. First, a resist is applied onto the FEM wafer (step 102). Next, a spectroscopic ellipsometry or the like measures the resist's optical constants (including the refractive index $n_0$ and absorption coefficient $k_0$) and coating thickness $t_0$ (step 104). A memory stores the measured refractive index $n_0$, absorption coefficient $k_0$, and coating thickness $t_0$.

The spectroscopic ellipsometry is an approach that evaluates the optical constant and coating thickness of a sample, such as a resist, by using different reflections of the s-polarized light and p-polarized light from the sample when the linear polarized light is introduced into the sample, as disclosed, for example, in Japanese Patent Publication No. 62-31289 and Japanese Patent Application, Publication No. 11-11655. The s-polarized light is defined as a component that has an electric field perpendicular to the incident surface. The p-polarized light is defined as a component that has an electric field parallel to the incident surface. A ratio ρ between $R_s$ and $R_p$ is defined in Equation 1 below, where $R_s$ is the complex reflectance to the s-polarized light, $R_p$ is the complex reflectance to the p-polarized light, tanψ is an amplitude reflectance ratio, and Δ is a phase difference of the s-polarized light to the p-polarized light:

$$\rho = R_s/R_p = \tan\psi \cdot \exp(i\Delta) \quad (1)$$

The ellipsometry that measures with plural wavelengths of lights is called spectroscopic ellipsometry, and calculates the optical constant and coating thickness by utilizing a fact that the amplitude reflectance ratio tanψ and phase difference Δ greatly vary as the sample's optical constant and coating thickness.

Figure 2:
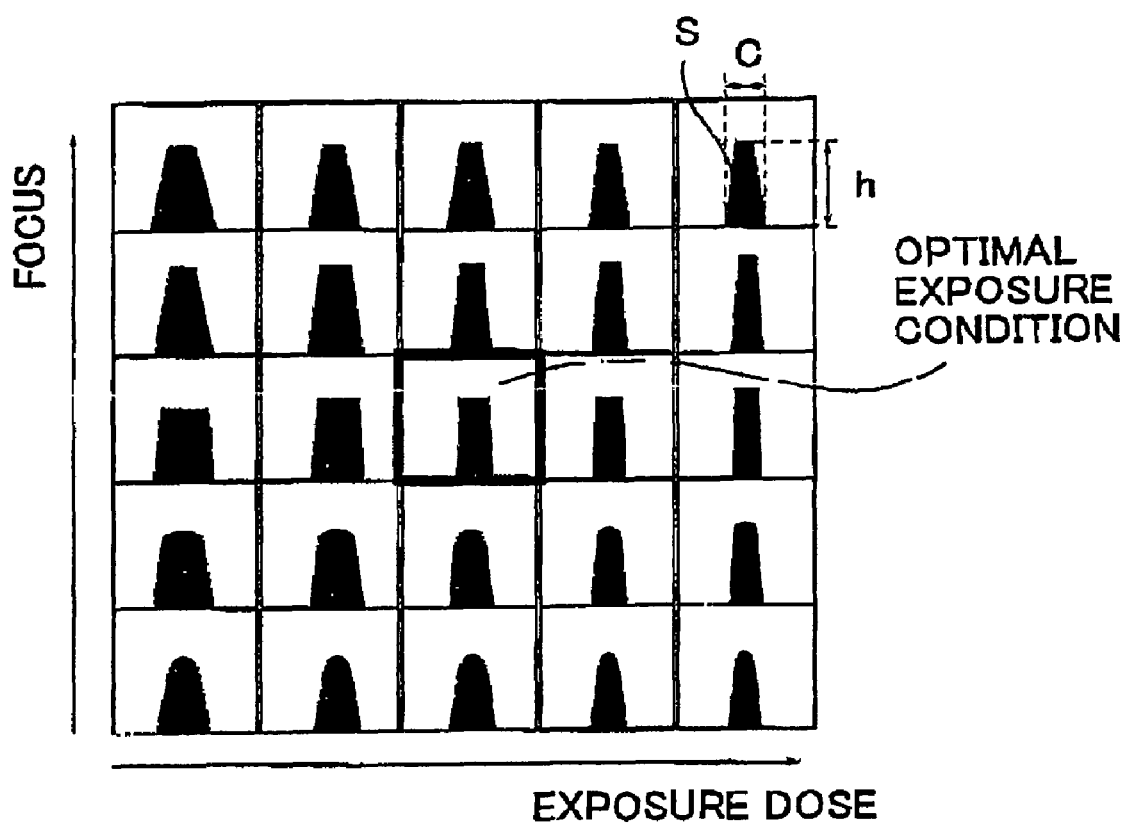
FIG. 2 is an enlarged sectional view showing FEM pattern's sectional shapes at respective shots on a FEM wafer.

Turning back to FIG. 1, a FEM pattern is formed on the resist-applied FEM wafer as shown in FIG. 2 (step 106). The FEM pattern is exposed onto each shot on the FEM wafer by changing the exposure dose and/or focus. Next, a CD-AFM or the like measures the FEM pattern's sectional shape (such as a line width "c", a height "h", and a sidewall angle "s") formed on the FEM wafer (step 108). FIG. 2 is an enlarged sectional view of the FEM pattern formed on each shot on the FEM wafer. FIG. 2 graphically shows the FEM pattern's sectional shapes exposed with different exposure doses and focuses. The abscissa axis denotes exposure doses, and the ordinate axis denotes focuses.

Figure 3:
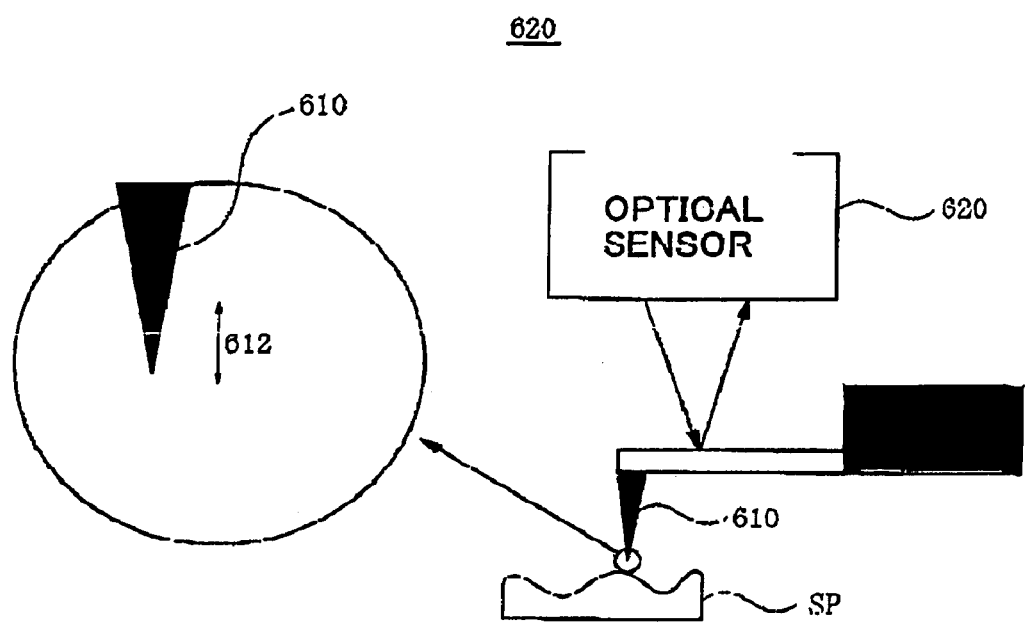
FIG. 3 is a schematic block diagram showing one exemplary CD-AFM structure.

The CD-AFM attempts to measure a critical dimension ("CD"), as disclosed, for example, in Japanese Patent Application, Publication No. 2002-350128, and is implemented, for example, as a Digital Instruments, Inc., Dimension Series AFM, which is developed to measure a line width, a pitch, a depth, a sidewall angle, and a roughness. FIG. 3 is a schematic block diagram of one exemplary structure of the CD-AFM 600. As shown in FIG. 3, according to the measurement principle in a perpendicular direction of the CD-AFM 600, a tip 612 (with a radius between 5 nm and 20 nm) of a probe 610 is moved close to a position that applies an interatomic force to a surface of an object to be measured SP, and an optical sensor 620 (that has a perpendicular resolution of 0.8 nm) detects the position of the probe 610. As to a horizontal direction, a piezoelectric element is driven within a range of maximum 70 μm, and an optical sensor 620 (with a horizontal resolution of 1 nm) similarly detects the position of the probe 610. Thereby, a three-dimensional shape of the object SP is measured.

FIG. 4 shows a relationship among the FEM pattern's sectional shape on each shot measured in step 108, and the exposure dose and focus used to produce the FEM pattern. The exposure dose and the focus optimal to exposure of the circuit pattern are set based on the relationship among the FEM pattern's sectional shape, the exposure dose and focus (step 110). The best exposure dose and focus established in the step 110 are used as exposure parameters in optimal process window information for exposure of a circuit pattern, which will be described later.

A relational equation that represents a relationship among the exposure dose, focus and the FEM pattern's sectional shape is calculated as a N-th order polynomial by using the multivariate analysis (step 112). The relational equation is used to calculate an offset amount from the optimal process window of the pattern exposed on the mass-produced wafer, which will be described later.

Figure 5:
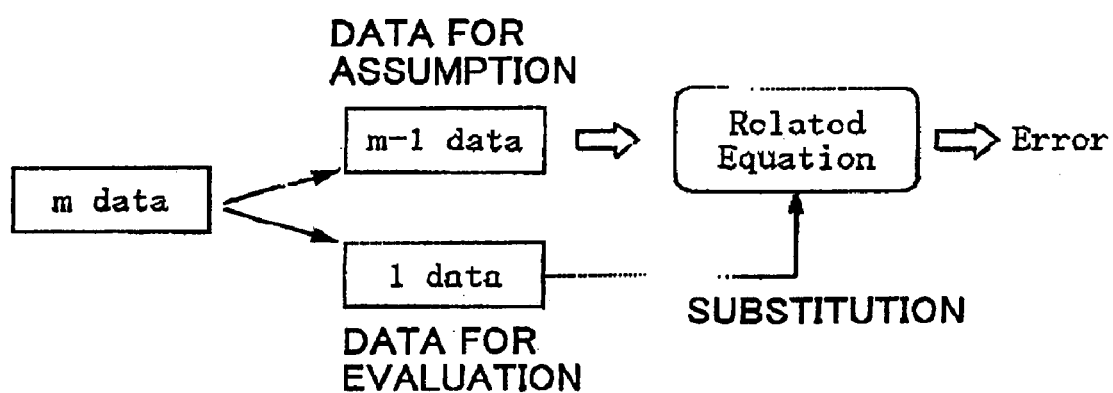
FIG. 5 is a view for explaining a cross validation.

In the step 112, the cross validation, for example, can verify the accuracy of the relational equation using the polynomial approximation calculated by the multivariate analysis. A description will be given of the cross validation with reference to FIG. 5. FIG. 5 is a view for explaining the cross validation.

The cross validation classifies m pieces of training data into data for assumption and data for evaluation, applies the evaluation data to an approximate equation calculated from the assumption data so as to calculate a assumed value, and evaluates the accuracy of the approximate equation based on a difference between the assumed value and the evaluation data. In classifying data, the evaluation data often uses (m−1) pieces of data and one piece of data is used for evaluation. This method conceives m ways of classifications so that each of m pieces of data is used for the evaluation data once, and evaluates a difference value between an assumed value obtained for each time and the evaluation data.

For example, when the FEM pattern has 5×5=25 shots, as shown in FIG. 2, a shape measuring apparatus, such as a CD-AFM and a SEM, measures the line width "c", the height "h" and the sidewall angle "s" of a sectional shape of the FEM pattern for each shot. A relational equation among the measured line width "c", height "h" and sidewall angle "s" and the focus FC is expressed by a N-th order polynomial as shown, for example, by Equation 2 below, where N is an integer, and m is an integer between 1 and m. Then, the cross validation verifies the calculated polynomial approximation:

$$FC_m = c(x_m)^N + h(y_m)^N + s(z_m)^N + c(c_m)^{N-1} + \quad (2)$$
$$h(y_m)^{N-1} + s(z_m)^{N-1} + \ldots + c(x_m) + h(y_m) + s(z_m)$$

As discussed, FIG. 4 partially excerpts a relationship among the FEM pattern's line width "c", height "h" and sidewall angle "s" for 25 shots in FIG. 2, and the exposure dose and focus for each shot.

Here, a relationship among the focus, line width "c", height "h", and sidewall angle "s" is calculated as a N-th order polynomial as shown in Equation 3 below by the multivariate analysis from a data group that removes the first line of data, or from data of the second line to the twentieth line:

$$FC_1 = c_{11}x_1 + c_{12}x_1^2 + \ldots + c_{1N}x_1^N + h_{11}y_1 + h_{12}y_1^2 + \quad (3)$$
$$\ldots + h_{1N}y_1^N + s_{11}z_1 + s_{12}z_1^2 + \ldots + s_{1N}Z_1^N + a_1$$

Then, a difference value $\Delta E_1$ between the focus obtained from Equation 3 and the actual focus (for the first line of data shown in FIG. 4) is calculated by substituting for Equation 3 the line width "c", height "h", sidewall "s" of the first line of data that is removed when a relational equation or Equation 3 is calculated.

Next, a relationship among the focus, line width "c", height "h", and sidewall angle "s" is calculated as a N-th order polynomial as shown in Equation 4 below by the multivariate analysis from a data group that removes a second line of data, or from data of the first line, the third line to the twentieth line:

$$FC_2 = c_{21}x_2 + c_{22}x_2^2 + \ldots + c_{2N}x_2^N + h_{21}y_2 + h_{22}y_2^2 + \ldots$$
$$+ h_{2N}y_2^N + s_{21}z_2 + s_{22}z_2^2 + \ldots + s_{2N}Z_2^N + a_2 \quad (4)$$

Then, a difference value $\Delta E_2$ between the focus obtained from Equation 4 and the actual focus (for the second line of data shown in FIG. 4) is calculated by substituting for Equation 4 the line width "c", height "h", sidewall "s" of the second line of data that is removed when a relational equation or Equation 4 is calculated.

Figure 6:
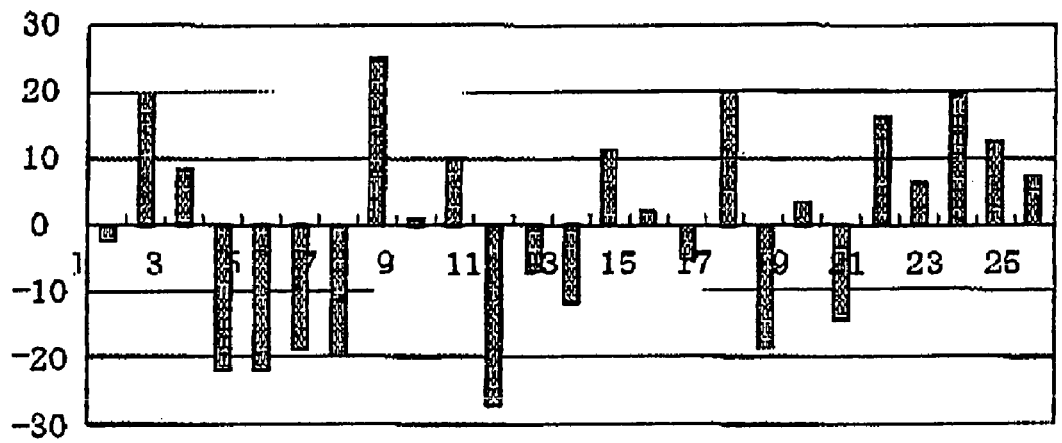
FIG. 6 is a graph showing difference values between the focus that uses data shown in FIG. 4 and the actual focus.

Thus, a N-th order polynomial approximation is calculated in the above manner whenever each data shown in FIG. 4 line by line is removed in order, and $\Delta E_m$ is calculated using the approximate equation. FIG. 6 graphs difference values $\Delta E_1$ to $\Delta E_{25}$ calculated by using data shown in FIG. 4. In FIG. 6, the abscissa axis denotes difference values between the focus calculated by the polynomial approximation and the focus of data for evaluation. The ordinate axis denotes numbers of data for assumption. In FIG. 6, a maximum value of $\Delta E$ expresses the approximate accuracy of the N-th order polynomial approximation.

In order to find out the optimal order in the N-th order polynomial approximation expressed by Equations 3 and 4, first order to N-th order polynomial approximations are set, for example, the cross validation is applied to the equation of each order, a value $E_N$, which is a value by dividing a square sum of the difference values $\Delta E_1$ to $\Delta E_{25}$ expressed by Equation 5 below by the number of pieces of data, is calculated for each order of an approximate equation:

$$E_N = \Delta E_1^2 + \Delta E_2^2 + \ldots + \Delta E_m^2 \quad (5)$$

Figure 7:
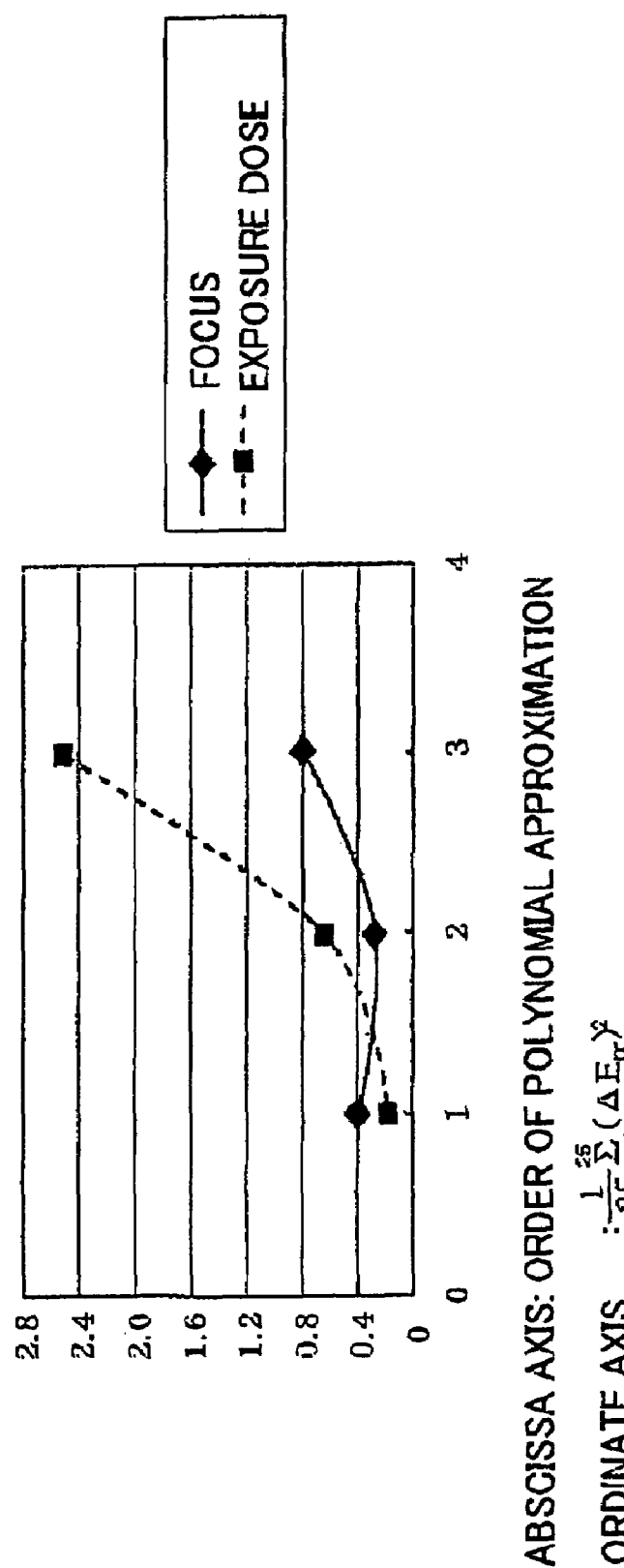
FIG. 7 is a graph for calculating the order that minimizes approximate differences in a relational equation among the focus (or exposure dose), the line width, the height, and the sidewall angle.

In this case, m=25. In the first order to N-th order polynomial approximations, an equation having an order that minimizes $E_N$ is selected. FIG. 7 is a graph showing which of the first order to third order polynomial approximations minimizes an approximate error in a relational equation among the focus (or exposure amount), the line width, the height and the sidewall angle. In FIG. 7, the abscissa axis denotes the order of the polynomial approximations, and the ordinate axis denotes $E_N$. The graph shown in FIG. 7 indicates that the focus prefers use of the first order polynomial approximation, and the exposure dose prefers use of the second order polynomial approximation.

The above embodiment calculates the relational equation among the focus, the line width, the height and the sidewall angle. Similarly, a relational equation among the exposure dose, the line width, the height and the sidewall angle is calculated. The step 112 calculates a correlation among the exposure dose and focus and the FEM pattern's sectional shape, and the polynomial approximation calculated in the step 112 is used for step 134, which will be described later.

Turning back to FIG. 1, the sequence B for the mass-produced wafer, which exposes a circuit pattern first applies the resist on the mass-produced wafer (step 122). Next, a spectroscopic ellipsometry or the like measures the resist's optical constants (including the refractive index $n_1$ and absorption coefficient $k_1$) and coating thickness $t_1$ (step 124).

Then, the resist's optical constants (including the refractive index $n_1$ and absorption coefficient $k_1$) and coating thickness $t_1$ measured in the step 124 and the resist's optical constants (including the refractive index $n_0$ and absorption coefficient $k_0$) and coating thickness $t_0$ measured in the step 104 are compared, and it is determined whether the resist's optical constants (including the refractive index $n_1$ and absorption coefficient $k_1$) and coating thickness $t_1$ measured in the step 124 fall within permissible ranges set for the resist's optical constants (including the refractive index $n_0$ and absorption coefficient $k_0$) and coating thickness $t_0$ measured in the step 104 (step 126). Here, the permissible ranges set for the resist's optical constants (including the refractive index $n_0$ and absorption coefficient $k_0$) and coating thickness to measured in the step 104 are expressed by Equations 6 to 8 below. In these equations, n', k' and t' are set so that exposed pattern's line width, height and sidewall angle fall within preset specification when a pattern is exposed with the optimal exposure dose and focus established by the step 106, even though the resist's optical constants (including the refractive index $n_1$ and absorption coefficient $k_1$) and coating thickness $t_1$ measured in the step 124 change within the permissible ranges:

$$|n_0 - n_1| < n' \quad (6)$$

$$|k_0 - k_1| < k' \quad (7)$$

$$|t_0 - t_1| < t' \quad (8)$$

If the resist's optical constants (including the refractive index $n_1$ and absorption coefficient $k_1$) and coating thickness $t_1$ measured in the step 124 does not fall within permissible ranges, the procedure returns to the step 102 and the optima exposure dose and focus are reset by the step 104 and subsequent steps. If the resist's optical constants (including the refractive index $n_1$ and absorption coefficient $k_1$) and coating thickness $t_1$ measured in the step 124 fall within permissible ranges set for the resist's optical constants (including the refractive index $n_0$ and absorption coefficient $k_0$) and coating thickness $t_0$ measured in the step 104, the exposure uses the optimal exposure dose and focus set in the step 110 as part of the exposure parameters (step 128).

Next, a CD-AFM or the like measures the FEM pattern's sectional shape (such as a line width "c", a height "h", and a sidewall angle "s") formed on the mass-produced wafer (step 130). It is determined whether the pattern's sectional shape measured in the step 130 falls within the preset specification (step 132). When the pattern's sectional shape measured in the step 130 falls within the preset specification, the procedure returns to the step 128, followed by an exposure of the next wafer or next lot.

Figure 8:
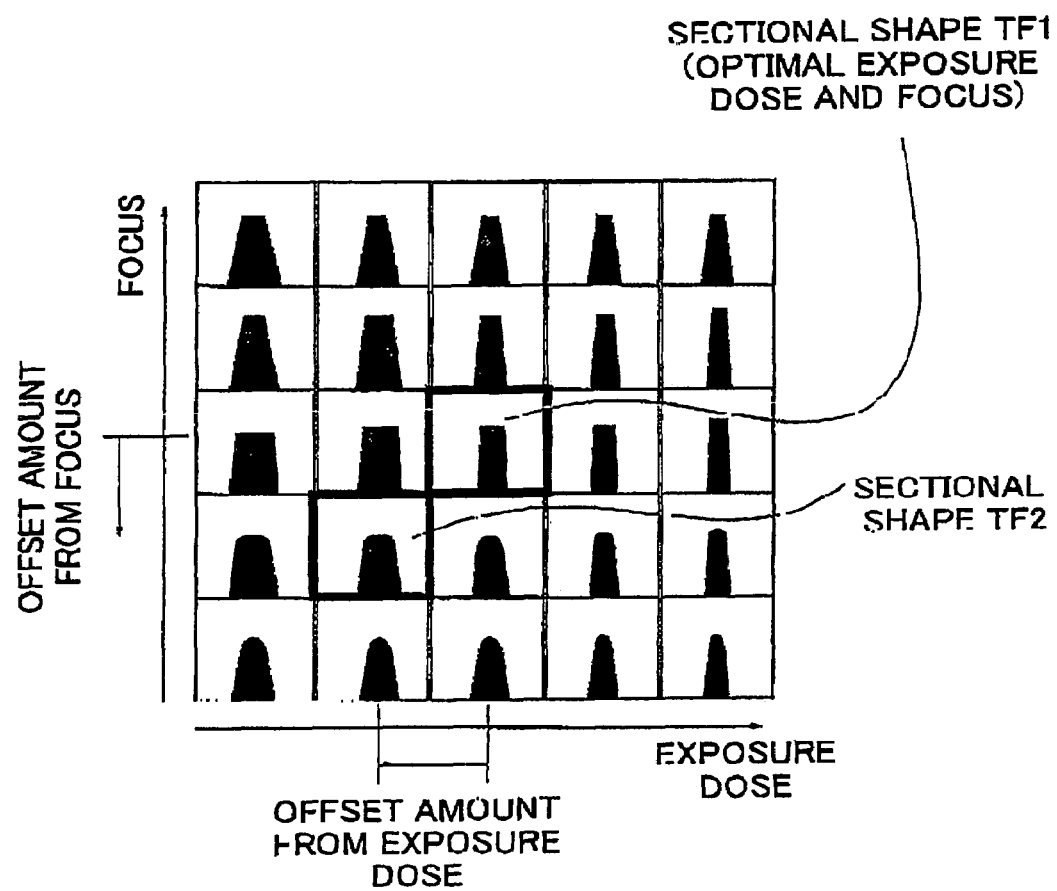
FIG. 8 is an enlarged sectional view showing a sectional shape of a pattern formed on a mass-produced wafer.

On the other hand, when the pattern's sectional shape measured in the step 130 does not fall within the preset specification, the cause is regarded as possible offsets of the exposure dose and focus at the actual exposure time from the set optimal values. Therefore, offset amounts are calculated from the correlation obtained in the step 112 (step 134). A description will be given of the offset amounts of the exposure dose and focus: Suppose, for example, that the optimal exposure dose and focus are set when the pattern that has a sectional shape TF1 is regarded as the best sectional shape, as shown in FIG. 8, and the a pattern measured by the step 130 has a sectional shape TF2. Here, FIG. 8 is an enlarged sectional view showing the pattern's sectional shape formed on the mass-produced wafer.

The sectional shape TF2's line width, height and sidewall angle are substituted for the N-th order polynomial approximation that represents the correlation among the exposure dose, focus, and sectional shape calculated in the step 112. Then, differences between the exposure dose and focus calculated by the relational equation and the optimal exposure dose and focus set by the step 110 are calculated. Finally, the differences are considered and the exposure dose and focus are reset for use with next wafer or next lot (step 136).

While the instant embodiment uses the cross validation and 25 pieces of data shown in FIG. 4 to calculate the polynomial approximation that represents a relationship between the focus and the pattern's sectional shape (including a line width, a height and a sidewall angle), or the polynomial relationship that represents a relationship between the exposure dose and the pattern's sectional shape (including a line width, a height and a sidewall angle), the number of pieces of data is not limited to this number but can be arbitrarily determined. While the first order to third order approximate equations are used to determine the optimal order of the polynomial approximation, the candidate orders are not limited to them. While the instant embodiment uses the N-th order polynomial approximation to calculate a correlation among the exposure dose and focus and pattern's sectional shape (including a line width, a height and a sidewall angle), the neural net method, for example, can be used to calculate the correlation.

The sequence A may prepare a database that includes plural pieces of data shown in FIG. 4 by changing the resist's optical constants (including the refractive index and the absorption coefficient) and the coating thickness, and the sequence B may establish the optimal exposure dose and focus based on the measured resist's optical constants and coating thickness by referring to the database. Therefore, the database that includes data shown in FGI. 4 for each resist's optical constants (including the refractive index and the absorption coefficient) and coating thickness is also one aspect of this embodiment.

This is the end of a discussion of the first embodiment of the present invention. Next follows a second embodiment of the present invention. The instant embodiment addresses various conditions in addition to the resist's optical constants discussed in the first embodiment.

While the first embodiment addresses the resist's optical constants, the instant inventor has found that differences in the following conditions between the test wafer and the mass-produced wafer may possibly cause inaccurate calculations of the optimal exposure dose and focus. Various conditions that may possibly affect the optimal exposure dose and focus include:

i) an application of a resist and an application method of the resist in the development apparatus, for example, the number of revolutions of a wafer holder, an application period of time, and a shape and arrangement of a nozzle that drops the resist;

ii) a pre-baking temperature and period of time for the wafer;

iii) a post exposure baking ("PEB") temperature and period of time for the wafer;

iv) the optical constants of a material of a primary coat in the wafer; and v) the temperatures, humidities, air pressures for the resist application, and environments in which the developing apparatus and the semiconductor exposure apparatus are placed.

This process information derives from a monitor attached to a semiconductor manufacturing apparatus, such as a resist coater and a developing apparatus, and an environment-monitoring machine in a semiconductor factory.

When the above process factors differ between the test wafer and the mass-produced wafer, the pattern's shape (including the line width, height, and sidewall angle) will be differently formed even under the common focus and exposure dose. Therefore, it is necessary to control the pattern forming processes between the test wafer and the mass-produced wafer, and to maintain these conditions to be the same.

Figure 9:
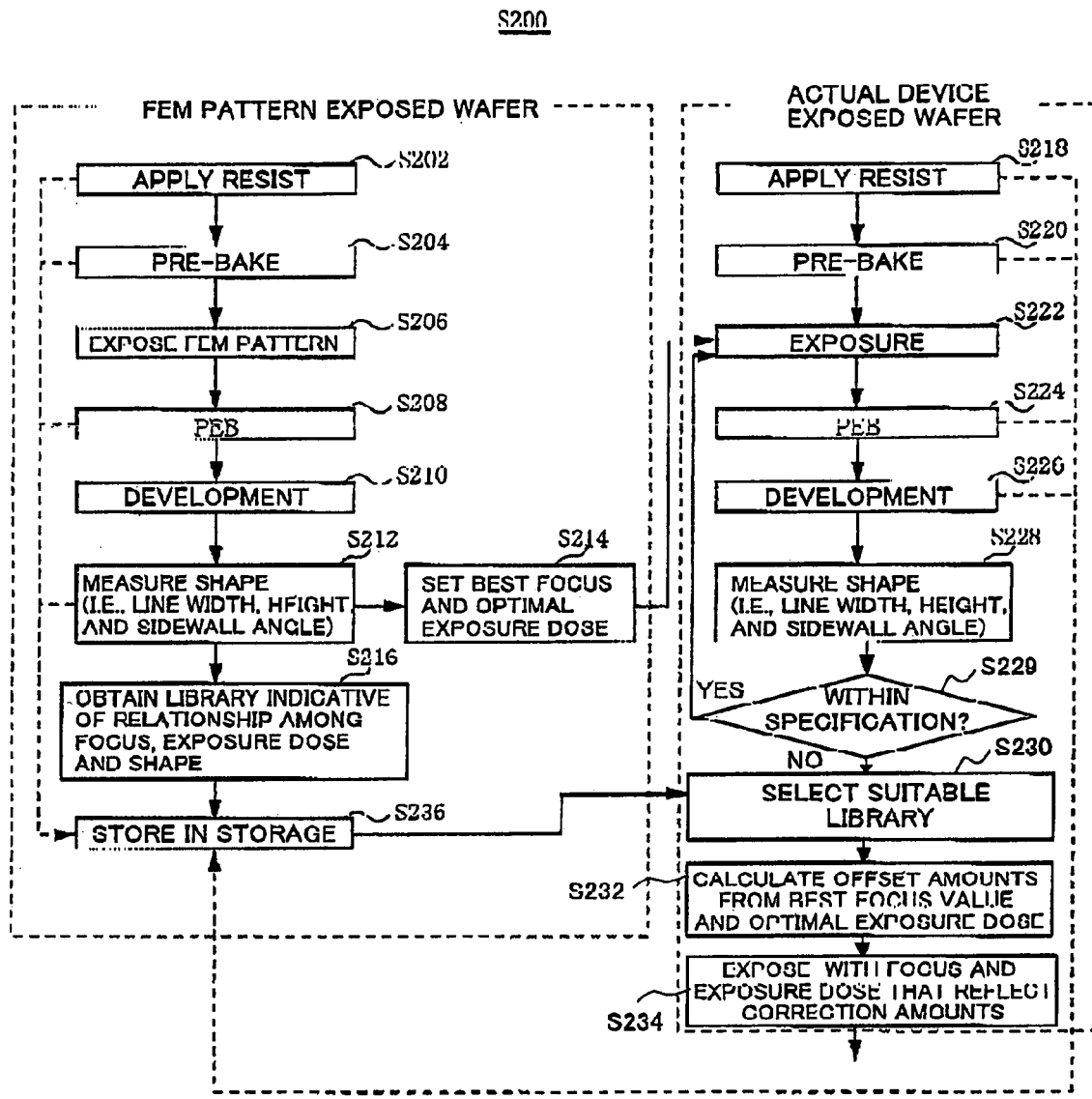
FIG. 9 is a flowchart for explaining an exposure apparatus of a second embodiment.

A description will now be given of the second embodiment with reference to the accompanying drawings. This embodiment also uses some figures used for the first embodiment. FIG. 9 is a flowchart for explaining a method for measuring offsets of the focus and exposure dose in the exposure sequence 200 of the wafer in the inventive system.

The measurement sequence is broadly classified into two, similar to the first embodiment. One sequence includes the steps of preparing a test wafer on which a FEM pattern (which is a matrix pattern exposed on respective shots on one wafer, and depends upon the exposure parameters of the exposure dose and focus) has been exposed, setting the optimal exposure condition using the test wafer, and correlating the exposure condition with the FEM pattern shape using the multivariate analysis. The other sequence exposes the mass-produced wafer based on a result of the multivariate analysis, and calculates offset amounts of the focus and exposure dose from shape measurement values of the shape measuring marks exposed on the mass-produced wafer.

A description will now be given of the sequence on the test wafer onto which the FEM pattern is exposed. First, the resist is applied onto the wafer (step 202), and the resist-applied wafer is pre-baked to stabilize the characteristics of the resist (step 204). Next, the wafer is carried to the exposure apparatus, and the FEM pattern is exposed onto the wafer (step 206). Then, the wafer is subject to the steps of the post exposure bake ("PEB") (step 208), and the development (step 210). As a result, the FEM pattern is formed on the test wafer. Next, a CD-AFM or the like measures the FEM pattern's sectional shape (such as a line width, a height and a sidewall angle) formed on the FEM wafer (step 208). Then, the FEM pattern shown in FIG. 2 is obtained similar to the first embodiment.

Similar to the first embodiment, a table is prepared which correlates the shape measuring pattern's shape measurement values, focus values, and exposure doses of the FEM pattern shown in FIG. 4 for respective shots. The positions of the optimal focus values and exposure dose used to expose an IC pattern on the mass-produced wafer (step S222) are determined based on shape measurement values and exposure conditions (including the focus and exposure dose) (step 214) and used as the optimal exposure condition when the IC pattern is exposed onto the mass-produced wafer, which will be described later (step 222).

The step 216 in FIG. 9 prepares a relational equation of the N-th polynomial (referred to as a "library" hereinafter), which represents a relationship between the exposure condition and the FEM pattern's shape, by using the multivariate analysis.

The cross validation discussed in the first embodiment, for example, can verify the accuracy of the library obtained by the polynomial approximation and the multivariate analysis in the step 216. The library obtained in the step 216 is used for the step 232, which will be described later.

Figure 10:
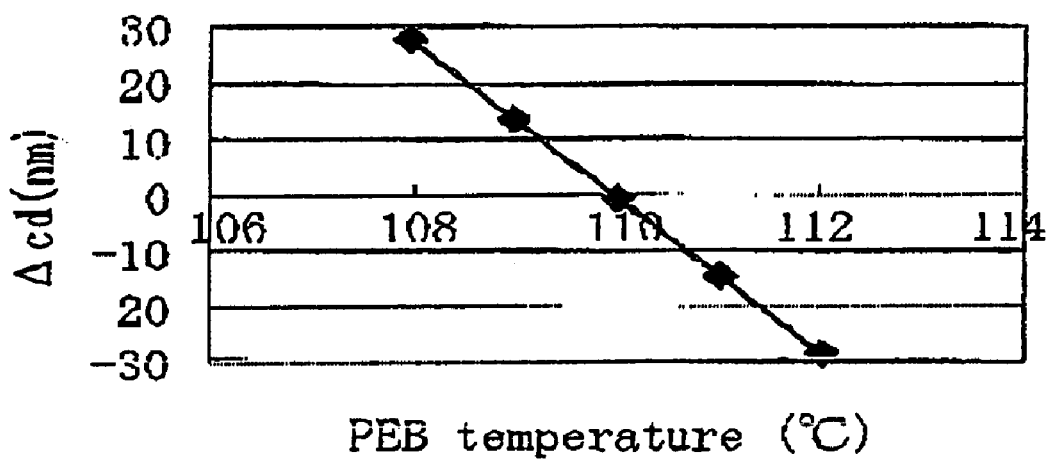
FIG. 10 is a graph for explaining a relationship between the PEB temperature and the pattern's line width.
Figure 11:
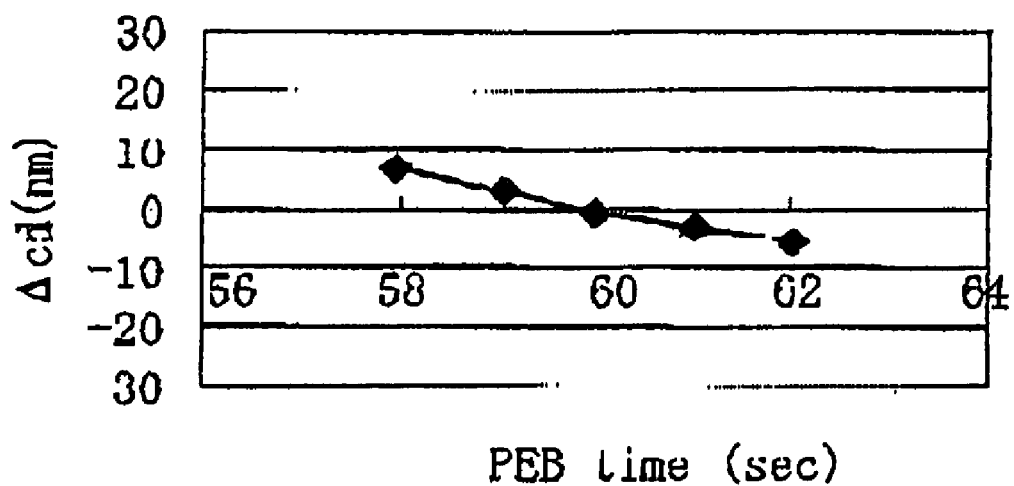
FIG. 11 is a graph for explaining a relationship between the PEB period of time and the pattern's line width.

This relational equation will vary depending upon the variance of the process condition for forming the FEM pattern. Therefore, the library may be prepared by using the FEM patterns prepared under plural exposure conditions, such as plural process conditions, such as PEB temperatures in the step 208 in FIG. 9. Alternatively, the library may be produced through simulations that calculate the shape changes of the FEM pattern relative to the process condition changes. In this case, the memory stores the calculated plural libraries while correlating them with the process conditions, such as the PEB temperatures (step 236). Here, FIGS. 10 and 11 are graphs showing changes of a pattern's line width relative to changes of the PEB period of time, and requires relational equations corresponding to changing wafer process conditions. In FIG. 9, dotted arrows extending from the steps, 202, 204, 208 and 210 indicate values of conditions relating to the wafer process in the semiconductor manufacturing apparatus to be monitored in each step, and the memory stores this monitor information with the library information (step 236). Here, the information to be monitored by each step includes information about the number of revolutions of the wafer holder when the resist coater applies the resist, and the application period of time, and the shape and arrangement of the nozzle that drops the resist on the wafer in the step 202, the pre-bake temperature and period of time in the resist developing apparatus after the resist is applied in the step 204, and the PEB temperature and period of time, and development period of time in the resist developing apparatus, and a composition of the developer in the step 208. A sensor monitors this monitor information from the semiconductor manufacturing apparatus on a regular basis.

The exposure sequence for the mass-produced wafer onto which the IC pattern is exposed first applies the resist as in step 218 in FIG. 9, and pre-bakes the wafer (step 220), followed by the exposure using the optimal focus value and exposure dose value obtained in the step 214 as part of the exposure parameter (step 222).

The wafer exposed in the step 222 is subject to the PEB (step 224) and development (step 226). Next, a CD-AFM or the like measures the shape-measuring pattern's line width, height, and a sidewall angle in the formed wafer (step 228).

It is then determined whether the pattern's sectional shape measured in the step 228 falls within the preset specification (step 229). When the pattern's sectional shape measured in the step 228 falls within the preset specification, the procedure returns to the step 222, followed by an exposure of the next wafer or next lot.

On the other hand, when the pattern's sectional shape measured in the step 228 does not fall within the preset specification, the shape change is regarded as possible offsets of the exposure condition, i.e., the exposure dose and focus, at the actual exposure time from the set optimal values. For example, suppose that the optimal exposure dose and focus are set when a pattern that has a sectional shape TF1 is regarded as the best sectional shape, as shown in FIG. 8, and the a pattern measured by the step 228 has a sectional shape TF2. The offset amounts of the focus and exposure dose are calculated in FIG. 8. More specifically, values of the line width, height and sidewall angle of the shape TF2 are substituted for the N-th order polynomial approximation that represents a relationship between the focus and exposure dose stored in the memory (step 236), so as to calculate differences between the numerical values of the focus and exposure dose calculated by the relational equation and the optimal focus value and exposure dose value. The next wafer and next lot are exposed with the exposure condition that has been reset by taking the differences into account.

In FIG. 9, the monitor information on each wafer process for the wafer process in the semiconductor manufacturing apparatus at the steps 218, 220, 224 and 226 for the mass-produced wafer is input to the memory by the flow shown by the dotted arrows. Here, the content of the monitor information is equivalent to the monitor information when the test wafer is prepared. For example, suppose that it is known that the PEB temperature change greatly affects the line width change in the semiconductor manufacture process in the instant embodiment. Then, the library that has the same PEB temperature as that obtained in the step 224 is selected from plural libraries stored in the memory (step 230), the offset amounts of the focus and exposure dose are calculated using the library (step 232), and the next wafer is exposed with the focus and exposure dose corresponding to the offset amounts (step 234).

While the instant embodiment addresses the PEB temperature as a factor that causes different shapes of exposed patterns in addition to changes of the focus and exposure amount, the factor is not limited to the PEB temperature. Any factor should be considered at the time of preparing the library if it affects the pattern's shape changes. For example, in addition to the PEB temperature, those factors, such as the number of revolutions of the wafer holder, an application period of time, a shape and arrangement of a nozzle that drops the resist in the resist coater, the pre-bake temperature and period of time, and the PEB period of time, may be considered in preparing the library. Other factors considered as relating to the shape changes may include changes of the temperature, humidity and air pressure in the environment of the semiconductor manufacturing apparatus. When these factors are considered, the memory stores changes of the temperature, humidity and air pressure, and the libraries corresponding to the environmental changes are prepared. Different materials of the primary coat before the resist is applied onto the wafer can cause shape changes, the libraries corresponding to the primary coat materials in the wafer are prepared.

While the instant embodiment uses the cross validation and 25 pieces of data shown in FIG. 4 to calculate the polynomial approximation that represents a relationship between the focus and the pattern's sectional shape (including a line width, a height and a sidewall angle), or the polynomial relationship that represents a relationship between the exposure dose and the pattern's sectional shape (including a line width, a height and a sidewall angle), the number of pieces of data is not limited to this number but can be arbitrarily determined. While the first order to third order approximate equations are used to determine the optimal order of the polynomial approximation, the candidate orders are not limited to them. While the instant embodiment uses the N-th order polynomial approximation to calculate a correlation among the exposure dose and focus and pattern's sectional shape (including a line width, a height and a sidewall angle), the neural net method can be used to calculate the correlation.

While this is the end of a discussion of the second embodiment, a more preferable embodiment can introduce feedback control over a semiconductor manufacturing apparatus so that the fluctuations of the wafer process, which are detected by the monitor function, fall within the permissible ranges. For example, when the pre-bake temperature changes in the resist developing apparatus exceeds the permissible range, the temperature is controlled so that the temperature falls within the permissible range. Thereby, the pre-bake temperature fluctuations that occur long-periodically fall within the permissible range. Even if there are shape changes caused by the unexpectedly happening pre-bake changes beyond control in the resist development apparatus, the precise measurement can be maintained by selecting a library corresponding to the pre-bake temperature change from plural libraries stored in the memory.

The first and second embodiments use the cross validation to verify the accuracy of the N-th polynomial approximation that represents the relationship among the exposure dose, focus and pattern's sectional shape (including the line width, height and sidewall angle), and determine the order of the polynomial approximation. Alternatively, the Akaike method may be used to determine the minimum order in the polynomial approximation.

The Akaike method is a method that calculates the optimal order of an autoregressive model so that the final prediction error ("FPE") can become as small as possible, as disclosed, for example, in Japanese Patent Application, Publication NO. 10-187452, and H. Akaike: Fitting Autoregressive Models for Prediction, Ann. Inste. Stat. Math., 21, 243/247 (1969), "Modern Control Series 1 'Signal Analysis and System Identification'", Takayoshi Nakamizo, published by Corona Inc., pp. 195-201, and "Science Library Information Computer 9 'Statistic Analysis and Control for Dynamic System'", Hiroshi Akaike and Toichiro Nakagawa, published by Science Inc., pp. 50-61. This method includes, even when the order N is unknown, the steps of calculating the order of the model in a range N=1, 2, ..., L, where L is a proper number, calculating a FPE value for each N-th order model, and selecting the order N that minimizes the FPE value, for the optimal order for the autoregressive model.

A description will now be given of a third embodiment of the present invention. The third embodiment is characterized in that an optical CD measuring apparatus measures a shape for each shot. While the step 108 in the first embodiment and the step 212 in the second embodiment use the CD-AFM to measure a shape of the shape measuring pattern in each shot in the FEM pattern, the instant embodiment uses an optical CD measuring apparatus.

The optical CD measuring apparatus is disclosed, for example, in Japanese Patent Applications, Publication Nos. 11-211421 and 11-211422. The optical CD measuring apparatus introduces polarized light, i.e., s-polarized light and p-polarized light, into a periodic pattern formed on an object whose line width is to be measured, and measures a state of the reflected light from the periodic pattern, such as a light intensity change or a phase change. As a result, this apparatus obtains a change amount of the state of the polarized light, such as an intensity change or a phase change, when the periodic pattern reflects the light, and measures the line width, height, and sidewall angle of the periodic pattern based on the obtained state change amount.

The assignee has already disclosed a method for measuring a line width of a periodic pattern, and for calculating the optimal exposure dose and focus in the exposure step in the exposure apparatus, for example, in Japanese Patent Applications, Publication Nos. 9-36037 and 10-22205.

The instant embodiment measures a periodic pattern's sectional shape by introducing the s-polarized light and p-polarized light, and linear polarized light having a phase difference of 0 and an amplitude ratio of 1 into the pattern, and measuring a phase difference $\Delta$ and an amplitude difference $\psi$ of the reflected light. This method is generally called the spectroscopic ellipsometry. While use of the spectroscopic ellipsometry has been explained to measure the resist's optical constants (including the refractive index and absorption coefficient) in the steps 104 and 124, the measurement principle of the optical CD measuring apparatus applies the spectroscopic ellipsometry to the periodic pattern. Although this measurement principle is disclosed, for example, in M. Born and E. Wolf: Principles of Optics, 6th Edition, Cambridge University Press, and Japanese Patent Application, Publication No. 11-211421, a description will now be given of the measurement principle for better understanding of the instant embodiment.

Figure 12:
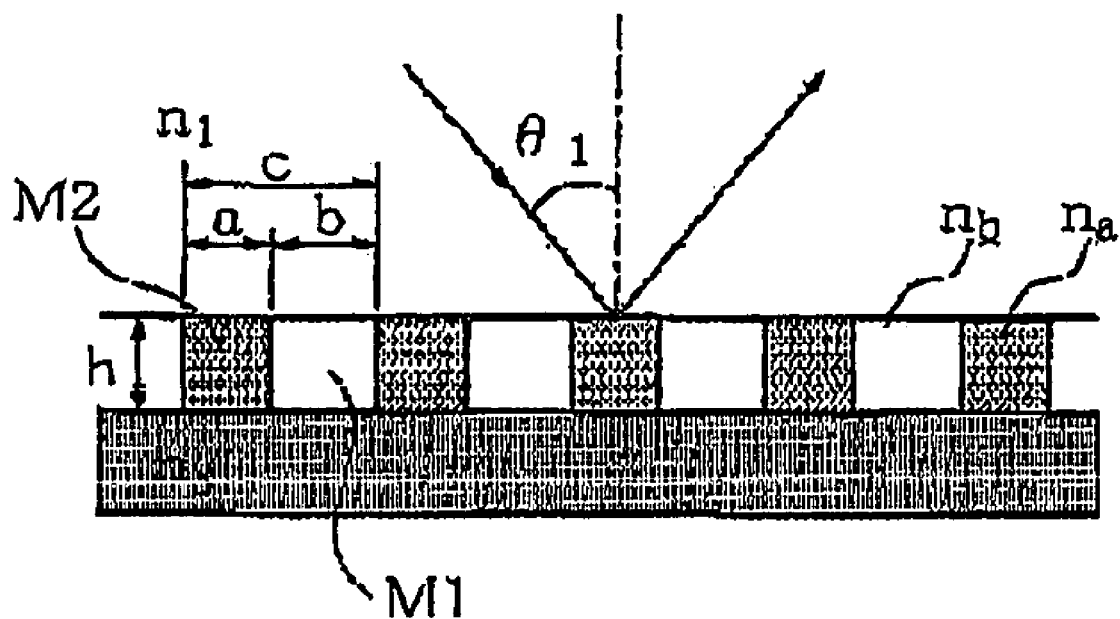
FIG. 12 is a schematic sectional view showing a wafer onto which a periodic line-and-space pattern is formed.

FIG. 12 is a schematic sectional view showing a wafer on which a periodic, line and space pattern is formed. As illustrated, it is known that a periodic structure that includes alternately arranged two media M1 and M2 having different refractive indexes has a birefringence, and this is called a form birefringence.

For example, suppose that the first medium M1 is air and the second medium M2 is a resist in FIG. 12. The light having a predetermined wavelength and predetermined polarization state is introduced into the periodic pattern at a predetermined incident angle, and combined light between the ray that has passed through the resist M2, been reflected by the wafer substrate W, and transmitted through the resist M2, and the ray that has been directly reflected on the resist M2 surface.

It is known that a phase type diffraction grating with a convex and concave pattern exhibits a birefringence without causing diffracted light for a wavelength greater than its pitch. While the instant embodiment addresses the measurement of the reflected light, the diffracted light, which is generated when a pitch of the resist pattern is greater than the wavelength, can be used for the measurement.

In FIG. 12, it is assumed that a laser beam that has a wavelength greater than a period is incident upon the periodic pattern perpendicularly, where "a" is a width of the resist (or second medium) M2, "b" is a width of the air (or first medium) M1, "c" (=a+b) is a sum of the width "a" of the resist (or second medium) M2 and the width "b" of the resist (or first medium) M1, "$n_a$" is a refractive index of the resist M2, "$n_b$" is a refractive index of the air M1, $\theta_1$ is an incident angle of the incident light, h is each height of the resist M2 and the air M1, "$n_1$" is a refractive index of a medium at the incident side, and "$n_3$" is a refractive index of the wafer substrate W. In the incident light, the s-polarized light is polarized light perpendicular to a plane in which the electric field vector is orthogonal to lines of the grating, and the p-polarized light is polarized light parallel to the plane in which the electric field vector is orthogonal to the grating lines. It is known that refractive indexes $N_o$ and $N_e$ at the periodic structure part relative to the s-polarized light and the p-polarized light are expressed by Equations 9 and 10 below:

$$N_o = (b/c)n_b^2 + (a/c)n_a^2 \tag{9}$$

$$N_e = n_b^2 n_a^2 / \{(b/c)n_a^2 + (a/c)n_b^2\} \tag{10}$$

It is understood from Equations 9 and 10 that the periodic pattern shown in FIG. 12 is equivalent to the uniaxial optical crystal having the refractive index $N_o$ relative to the s-polarized light and the refractive index $N_e$ relative to the p-polarized light. Therefore, the refraction coefficients $r_s$ and $r_p$ to the s-polarized light and the p-polarized light are those of the reflection coefficient of the thin film having the refractive index $N_o$ relative to the s-polarized light and the reflection coefficient of the thin film having the refractive index $N_e$ relative to the p-polarized light.

Figure 13:
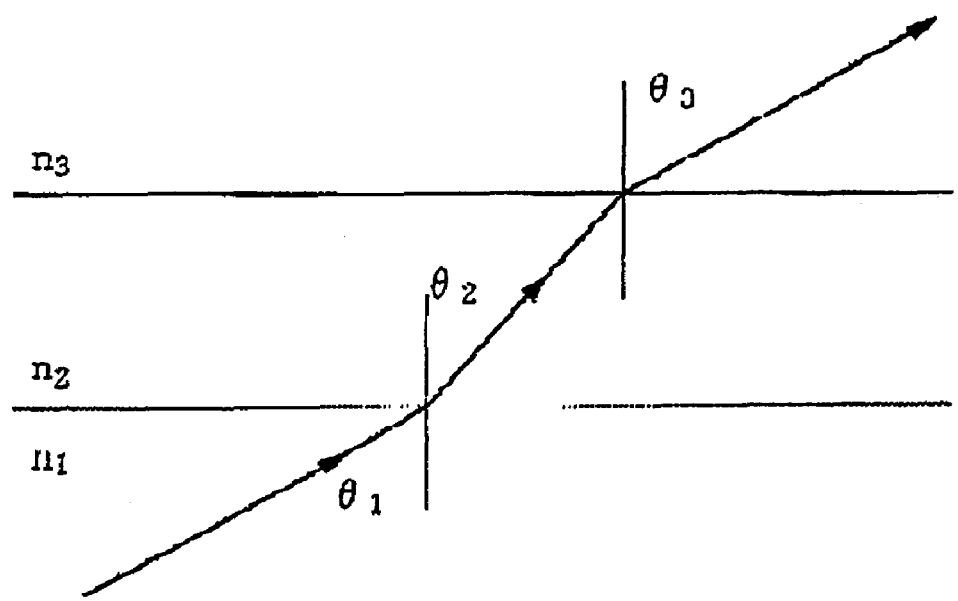
FIG. 13 is a view that graphically defines various amounts for calculating a reflection coefficient of a thin film.

A description will be given of various factors for calculating the reflection coefficients of the thin film. FIG. 13 is a view that graphically shows definitions of various factors to calculate the reflection coefficients of the thin film. FIG. 10 shows an optical path of transmission light, where $n_1$ is a refractive index of a medium at the incident side, $n_2$ is a refractive index of the thin film, $n_3$ is a refractive index of a wafer substrate W, $\theta_2$ is an angle of a ray that passes through the thin film, and $\theta_3$ is an angle of a ray that exits the thin film.

For the s-polarized light, Equations 11-14 are met for the reflection coefficient $r_s$ where it is assumed that the refractive index $n_2$ of the thin film in FIG. 13 is equal to the refractive index $N_o$:

$$r_s = \{r_{s12} + r_{s23} \cdot \exp(2i\beta_s)\} / \{1 + r_{s12} \cdot r_{s23} \cdot \exp(2i\beta_s)\} \quad (11)$$

$$r_{s12} = (n_1 \cdot \cos\theta_1 - N_o \cdot \cos\theta_2)/(n_1 \cdot \cos\theta_1 + N_o \cdot \cos\theta_2) \quad (12)$$

$$r_{s23} = (N_o \cdot \cos\theta_2 - n_3 \cdot \cos\theta_3)/(N_o \cdot \cos\theta_2 + n_3 \cdot \cos\theta_3) \quad (13)$$

$$\beta_s = (2\pi/\lambda) N_o \cdot h \cdot \cos\theta_2 \quad (14)$$

Similarly, for the s-polarized light, Equations 15-18 are met for the reflection coefficient $r_p$ where it is assumed that the refractive index $n_2$ of the thin film in FIG. 13 is equal to the refractive index $N_e$:

$$r_p = \{r_{p12} + r_{p23} \cdot \exp(2i\beta_p)\} / \{1 + r_{p12} \cdot r_{p23} \cdot \exp(2i\beta_p)\} \quad (15)$$

$$r_{p12} = (N_e \cdot \cos\theta_1 - n_1 \cdot \cos\theta_2)/(N_e \cdot \cos\theta_1 + n_1 \cdot \cos\theta_2) \quad (16)$$

$$r_{p23} = (n_3 \cdot \cos\theta_2 - N_e \cdot \cos\theta_3)/(n_3 \cdot \cos\theta_2 + N_e \cdot \cos\theta_3) \quad (17)$$

$$\beta_p = (2\pi/\lambda) N_e \cdot h \cdot \cos\theta_2 \quad (18)$$

$r_{s12}$ is the reflection coefficient of the s-polarized light generated at the border between the first and second media when the s-polarized light passes from the first medium to the second medium. $r_{s23}$ is the reflection coefficient of the s-polarized light generated at the border between the second and third media when the s-polarized light passes from the second medium to the third medium. $r_{p12}$ is the reflection coefficient of the p-polarized light generated at the border between the first and second media when the p-polarized light passes from the first medium to the second medium. $r_{p23}$ is the reflection coefficient of the p-polarized light generated at the border between the second and third media when the p-polarized light passes from the second medium to the third medium.

As indicated in Equations 9-18, when the duty ratio b/c of the periodic pattern changes, the equivalent refractive indexes $N_o$ and $N_e$ of the periodic pattern change and the reflection coefficient $r_s$ and $r_p$ of the periodic pattern consequently change. In other words, the reflection coefficient $r_s$ and $r_p$ are affected by the duty ratio b/c of the line width through the equivalent refractive indexes $N_o$ and $N_e$. As the reflection coefficient $r_s$ and $r_p$ change, a phase state of each polarized light changes, which is given at the time of reflection on the periodic pattern. Therefore, the duty ratio is calculated from a ratio of the light intensity and a phase difference of the reflected light from the periodic pattern.

The spectroscopic ellipsometry can reproduce the same ratio of the light intensity and phase difference even when the resist's coating thickness and pattern shape differ according to incident conditions (including the incident angle or a wavelength of the incident light). Therefore, pattern shapes that overlap each other under a certain incident condition are dissolved under another incident condition and identified by detecting changes of the reflected light under plural incident conditions.

Figure 14:
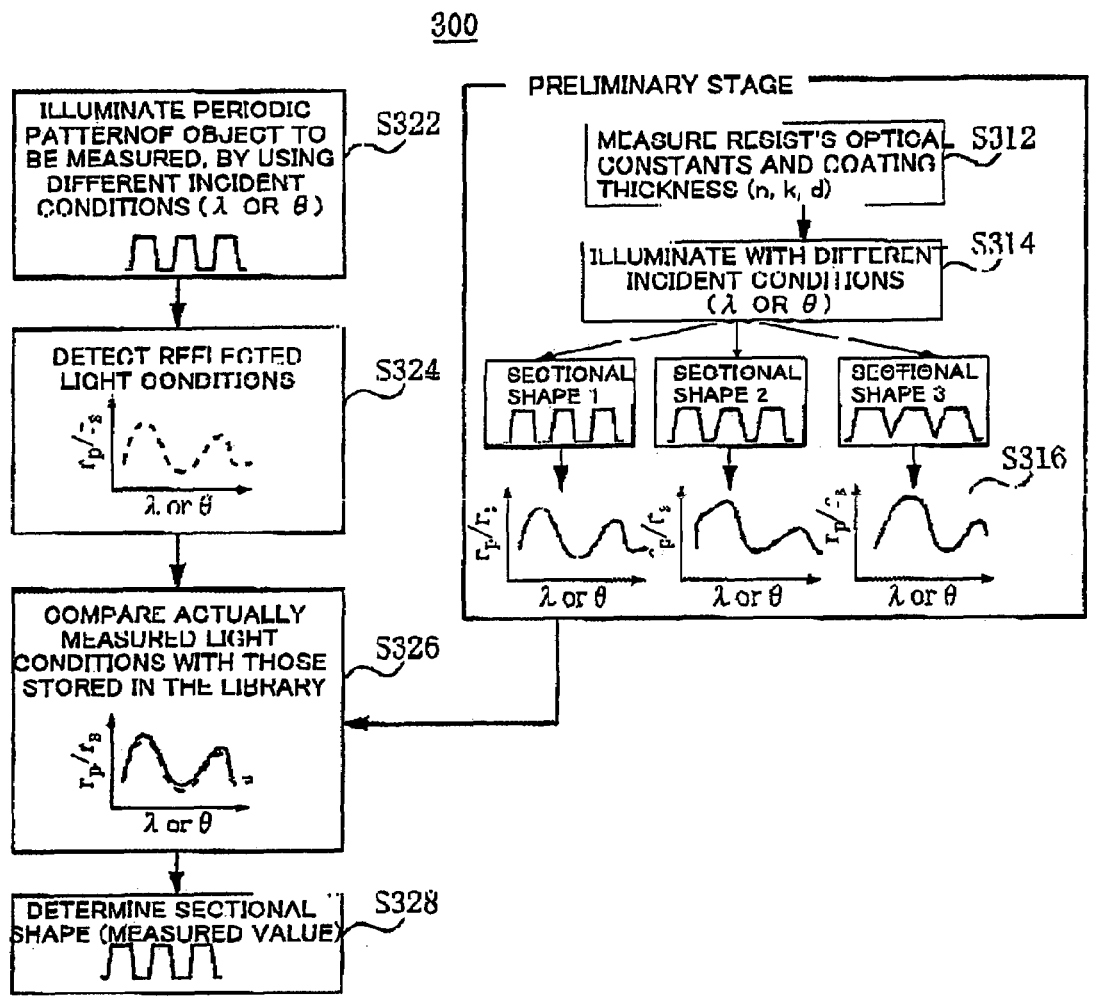
FIG. 14 is a flowchart for explaining a measurement method of a shape measuring apparatus.

The shape measuring apparatus that uses the spectroscopic ellipsometry is commercially available as an optical CD measuring apparatus from measuring instrument manufacturers. A description will be given of a measurement method of the shape measuring apparatus with reference to FIG. 14. FIG. 14 is a flowchart for explaining a measurement method 300 of the shape measuring apparatus.

Referring to FIG. 14, a preliminary stage prior to the measurement defines a sectional shape of a conceivable periodic pattern, introduces light under plural different incident conditions (including an incident angle and a wavelength of the incident light) (step 314) based on the optical information, such as a refractive index n and an absorption coefficient k, of the medium in the periodic pattern and each medium's thickness (step 312), and computes the light information, such as changes of the intensity ratio and the phase difference, of the light obtained from the defined sectional shape (step 316). These steps are conducted for plural different, predefined sectional shapes, and the memory stores the computation results obtained from the respective sectional shapes while correlating the computation result with the corresponding sectional shape. In general, the library is defined as a database that correlates the light information obtained by an individual computation with the corresponding periodic pattern's sectional shape based on certain optical constants and periodic patterns having different sectional shapes.

Next, the light is introduced into the periodic pattern for actual measurements (step 322), and the light information (about changes of the intensity ratio and the phase difference) of the resultant reflected light is acquired (step 324).

The light information that has been registered in the library and accords with the light information obtained by the actual measurement is picked up (step 326). A sectional shape of the predefined periodic pattern associated with the corresponding light information is regarded as a sectional shape of the periodic pattern that has been actually measured (step 328).

The optical CD measuring apparatus can measure, when applied to the steps 104, 108, 124 and 130 in FIG. 1, the resist's optical constants and coating thickness and pattern's sectional shape. Of course, it is applicable to the second embodiment. This is the end of a discussion of the third embodiment.

As discussed, the exposure method of each embodiment of the present invention uses the polynomial approximation obtained from the multivariate analysis to calculate and correct offset amounts, when the pattern's sectional shape formed on the wafer is different from the preset sectional shape, the offset amount, and resets the best exposure dose and focus. Therefore, a fine pattern with a high-quality sectional shape can be formed on the wafer.

A description will now be given of a fourth embodiment of the present invention.

The instant embodiment is characterized in that the FEM pattern for determining the best focus and optimal exposure dose for the mass-produced wafer has a different shape from that used to measure the offsets of the focus and exposure dose. The FEM pattern's shape denotes one of a pitch of the sectional-shape measuring marks to be exposed as the FEM pattern onto the wafer, a line width value, a space width value, and a combination thereof. FEM patterns 1 and 2 used for the instant embodiment differ in at least one of a pitch of the sectional-shape measuring marks to be exposed as the FEM pattern onto the wafer, a line width value, a space width value, and a combination thereof.

The sectional-shape measuring mark in the FEM pattern 1 is prepared to determine the best focus and the optimal exposure dose used to expose an IC pattern onto the mass-produced wafer. A sectional shape of the sectional-shape measuring mark is designed to have a line width equivalent to the intended line width of the IC pattern on the mass-produced wafer, and a repetitive pattern having a pattern width "a" and a space width "a" so that it is exposed as shown in FIG. 12 on the wafer, when it is exposed with the optimal exposure condition.

On the other hand, the sectional-shape measuring mark in the FEM pattern 2 is a mark used to calculate a relational equation among the focus, the exposure dose, and the mark shape. The mark exposed on the wafer forms a repetitive pattern with a pattern width "a" and a space width "5×a" as shown in FIG. 5.

The sectional-shape measuring mark in the FEM pattern 2 is different from that in the FEM pattern 1 in pitch and space width. When the FEM patterns 1 and 2 are exposed on the test wafer, the initial values of the focus and the exposure dose are set to the exposure condition more suitable for the FEM pattern 1. When the sensitivity of the shape change of the sectional-shape measuring mark in the FEM pattern 2 to changes to the focus and exposure dose is set higher than that of the FEM pattern 1, a more precise relational equation among the shape change, focus and exposure dose can be obtained.

For example, the optimal exposure condition obtained with the FEM pattern 1 is an exposure condition or a so-called pivotal condition such that no CD values of the exposed sectional-shape measuring mark change for a certain exposure dose even if the focus varies.

As discussed, when the sectional-shape measuring mark in the FEM pattern 2 has such a shape that a ratio between the line width and the space width is 1:5 relative to 1:1 of the FEM pattern 1, and forms an isolation pattern, the sectional shape change relative to the exposure condition change of the FEM pattern 2 changes more sensitive to the sectional shape change of the FEM pattern 1. Thus, as discussed, a more precise relational equation among the shape change, focus and exposure dose can be obtained.

Figure 17:
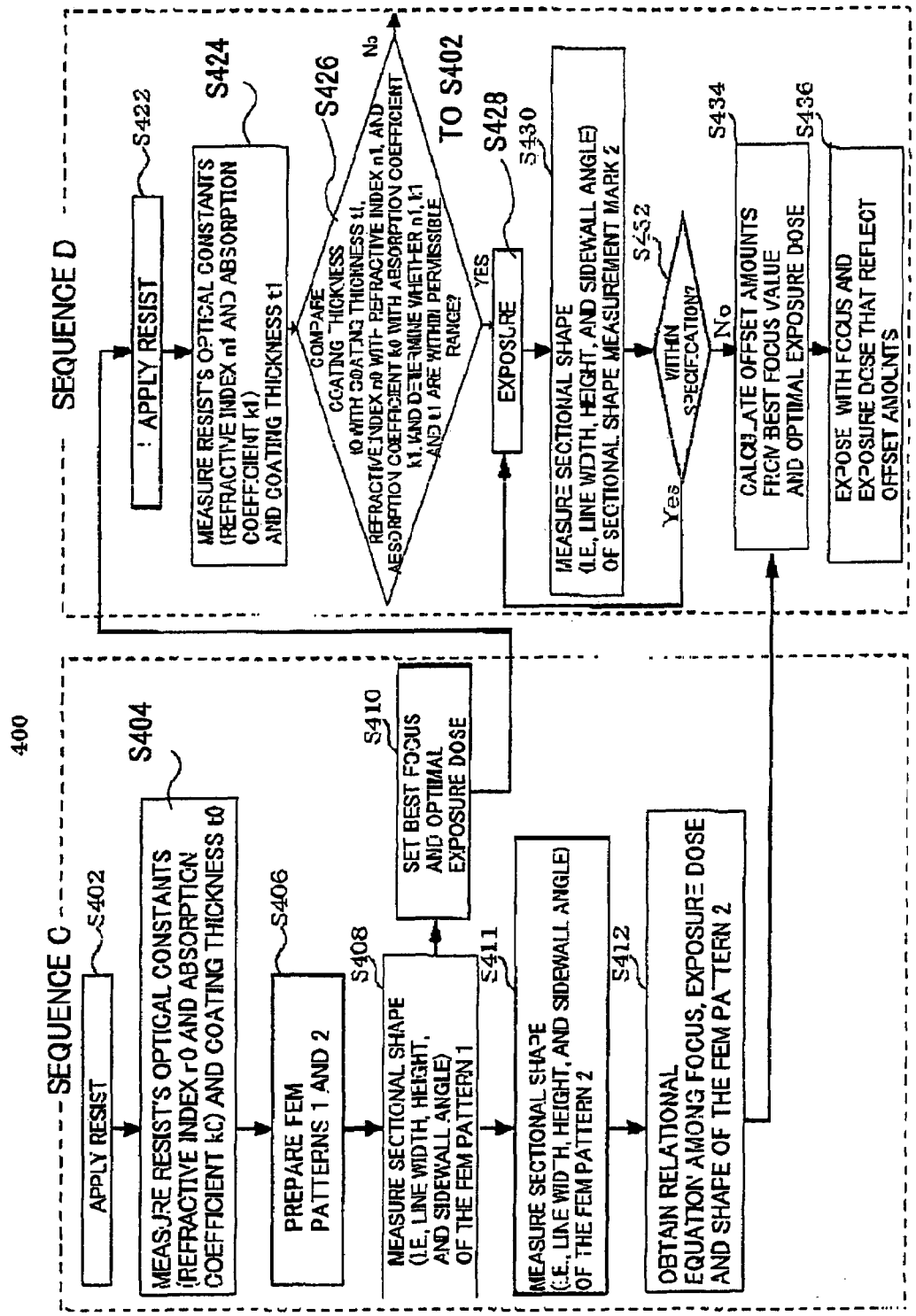
FIG. 17 is a flowchart for explaining an exposure method of a fourth embodiment.

A description will be given of a measurement method of the instant embodiment, which uses the two types of FEM patterns, with reference to FIG. 17.

An exposure method 400 controls the optical constants (refractive index and absorption coefficient) and/or coating thickness of the resist applied onto the test wafer and the mass-produced wafer, and form a fine pattern having a high-quality sectional shape. Referring to FIG. 17, the exposure method 400 includes two exposure flows, i.e., sequence C and sequence D. The sequence C includes the steps of preparing a FEM wafer (or a test wafer) on which a FEM pattern (which is a matrix pattern exposed on respective shots on one wafer and depends upon the exposure parameters of the exposure dose and focus) has been exposed, setting the optimal exposure dose and focus using the FEM wafer, and correlating the exposure dose and focus with the FEM pattern shape using the multivariate analysis. The sequence D exposes the actual process wafer (or mass-produced wafer) based on a result of the multivariate analysis.

A description will be given of the sequence C that exposes the FEM patterns 1 and 2 onto the FEM wafer. First, a resist is applied onto the FEM wafer (step 402). Next, the resist's optical constants (including the refractive index $n_0$ and absorption coefficient $k_0$) and coating thickness $t_0$ are measured using a spectroscopic ellipsometry etc. (step 104). The measured refractive index $n_0$, absorption coefficient $k_0$, and coating thickness $t_0$ are stored in the memory.

Figure 15:
FIG. 15 is a sectional shape of a sectional-shape measuring mark in a FEM pattern 1.
Figure 16:
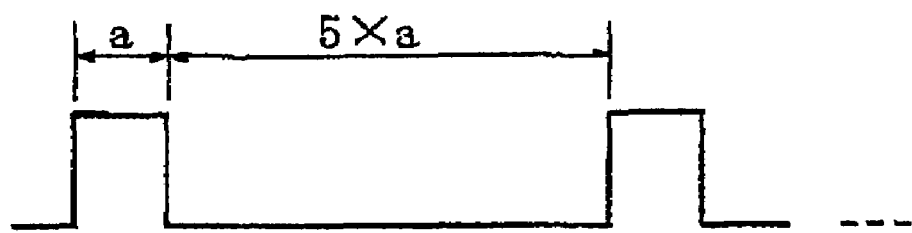
FIG. 16 is a sectional shape of a sectional-shape measuring mark in a FEM pattern 2.

The FEM patterns 1 and 2 are formed on the resist applied FEM wafer as shown in FIGS. 15 and 16 (step 406). The FEM pattern is exposed on respective shots on the FEM wafer by changing the exposure dose and/or focus. Next, the FEM pattern 1's sectional shape (such as a line width "c", a height "h", and a sidewall angle "s") formed on the FEM wafer is measured by using a CD-AFM etc. (step 408). FIG. 2 is an enlarged sectional view of the FEM pattern formed on respective shots on the FEM wafer. FIG. 2 graphically shows the FEM pattern's sectional shapes exposed with different exposure doses and focuses. The abscissa axis is an exposure dose, and the ordinate axis is a focus.

The exposure dose and the focus optimal to exposure of the circuit pattern are set based on the relationship among the FEM pattern 1's sectional shapes on the respective shots, the exposure dose and focus used to expose the FEM pattern 1 (step 410). The optimal exposure dose and focus established in the step 410 are used as exposure parameters in optimal process window information for exposure of the circuit pattern, which will be described later.

Then, the FEM pattern 2's sectional shape is measured (step 411), and a relational equation that represents a relationship between the exposure dose, focus and the FEM pattern 2's sectional shape is calculated as a N-th order polynomial by using the multivariate analysis (step 412). The relational equation is used to calculate an offset amount from the optimal process window of the pattern exposed on the mass-produced wafer, which will be described later.

In the step 412, the accuracy of the relational equation using the polynomial approximation calculated by the multivariate analysis can be verified, for example, by using the cross validation.

The step 412 calculates a correlation among the exposure dose and focus and the FEM pattern 2's sectional shape, and the polynomial approximation calculated in the step 412 is used for step 434, which will be described later.

The sequence B for the mass-produced wafer, which exposes a circuit pattern first applies the resist on the mass-produced wafer (step 422). Next, the resist's optical constants (including the refractive index $n_1$ and absorption coefficient $k_1$) and coating thickness $t_1$ are measured using a spectroscopic ellipsometry etc. (step 424).

Then, the resist's optical constants (including the refractive index $n_1$ and absorption coefficient $k_1$) and coating thickness $t_1$ measured in the step 424 and the resist's optical constants (including the refractive index $n_0$ and absorption coefficient $k_0$) and coating thickness $t_0$ measured in the step 404 are compared, and it is determined whether the resist's optical constants (including the refractive index $n_1$ and absorption coefficient $k_1$) and coating thickness $t_1$ measured in the step 424 fall within permissible ranges set for the resist's optical constants (including the refractive index $n_0$ and absorption coefficient $k_0$) and coating thickness $t_0$ measured in the step 404 (step 426). Here, the permissible ranges set for the resist's optical constants (including the refractive index $n_0$ and absorption coefficient $k_0$) and coating thickness $t_0$ measured in the step 104 are expressed, for example, by Equations 6 to 8. In these equations, n', k' and t' are set so that exposed pattern's line width, height and sidewall angle fall within preset specification when a pattern is exposed with the optimal exposure dose and focus established by the step 406, even when the resist's optical constants (including the refractive index $n_1$ and absorption coefficient $k_1$) and coating thickness $t_1$ measured in the step 424 change within the permissible ranges.

If the resist's optical constants (including the refractive index $n_1$ and absorption coefficient $k_1$) and coating thickness $t_1$ measured in the step 424 fall within permissible ranges, the procedure returns to the step 402 and the optima exposure dose and focus are reset by the step 404 and subsequent steps. If the resist's optical constants (including the refractive index $n_1$ and absorption coefficient $k_1$) and coating thickness $t_1$ measured in the step 424 fall within permissible ranges set for the resist's optical constants (including the refractive index $n_0$ and absorption coefficient $k_0$) and coating thickness $t_0$ measured in the step 404, the exposure uses the optimal exposure dose and focus set in the step 410 as part of the exposure parameters (step 428).

Next, the FEM pattern's sectional shape (such as a line width "c", a height "h", and a sidewall angle "s") formed on the mass-produced wafer is measured using a CD-AFM or the like. (step 430). The sectional-shape measuring mark for the FEM pattern 2 has been exposed on the mass-produced wafer and serves as a mark used to measure an offset of the exposure condition. It is determined whether the pattern's sectional shape measured in the step 430 falls within the preset specification (step 432). When the pattern's sectional shape measured in the step 430 falls within the preset specification, the procedure returns to the step 428, and an exposure of the next wafer or next lot starts.

On the other hand, when the pattern's sectional shape measured in the step 430 does not fall within the preset specification, the cause is regarded as possible offsets of the exposure dose and focus at the actual exposure time from the set optimal values. Therefore, offset amounts are calculated from the correlation obtained in the step 412 (step 434). Finally, the obtained offset amounts are considered and the exposure dose and focus are reset for use with exposures of the next wafer or next lot (step 436).

While the instant embodiment sets the shape (i.e., a ratio between a pattern width and a space width) of the sectional-shape measuring mark of the FEM pattern 1 to 1:1 and that of the FEM pattern 1 to 1:5, the ratio is not limited to this combination. The pattern width and space width of the sectional-shape measuring mark of the FEM pattern 1 may be varied according to the desired line width of the IC pattern. The shape of the sectional-shape measuring mark of the FEM pattern 2 can be varied according to the FEM pattern 1.

This is the end of a description of the fourth embodiment. The above various exposure methods are suitable for step-and-repeat and step-and-scan exposure apparatuses that produce highly precise semiconductor devices.

Figure 18:
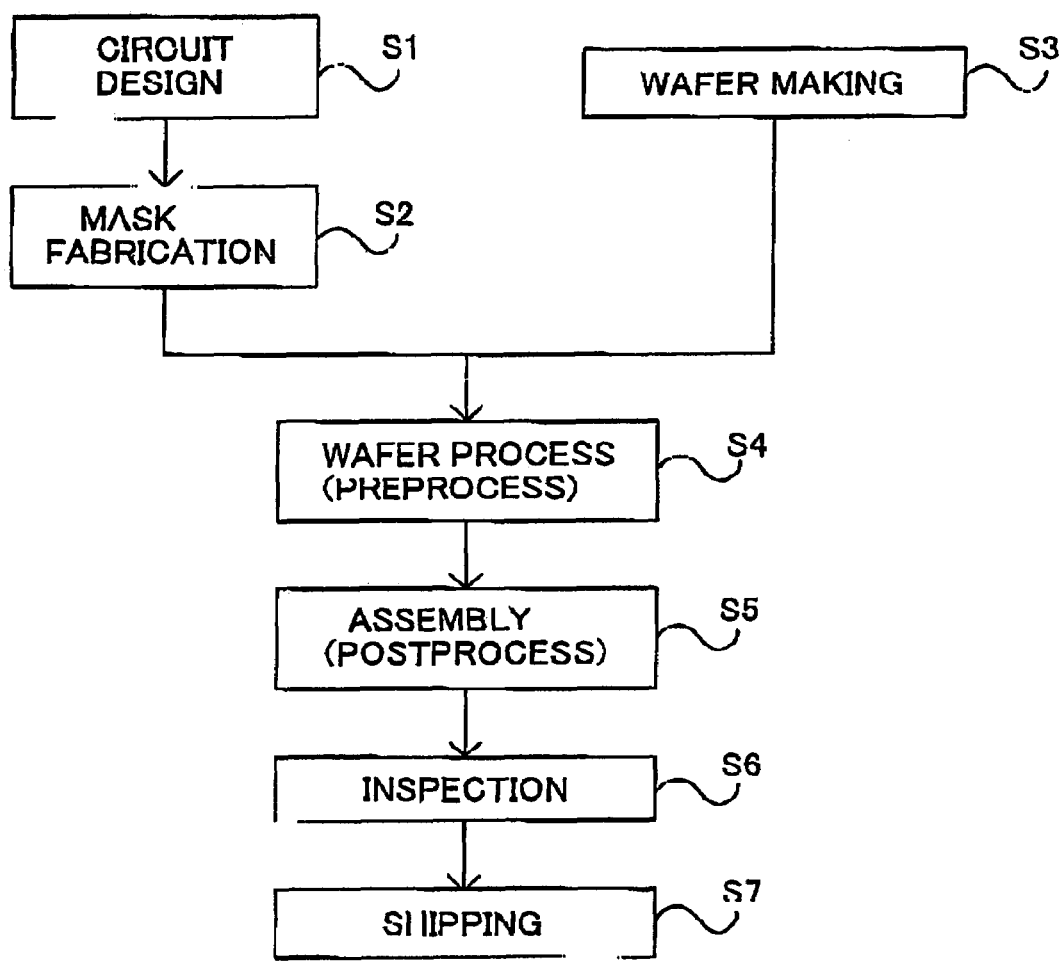
FIG. 18 is a flowchart for explaining a method for fabricating devices (semiconductor chips such as ICs, LSIs, and the like, LCDs, CCDs, etc.).
Figure 19:
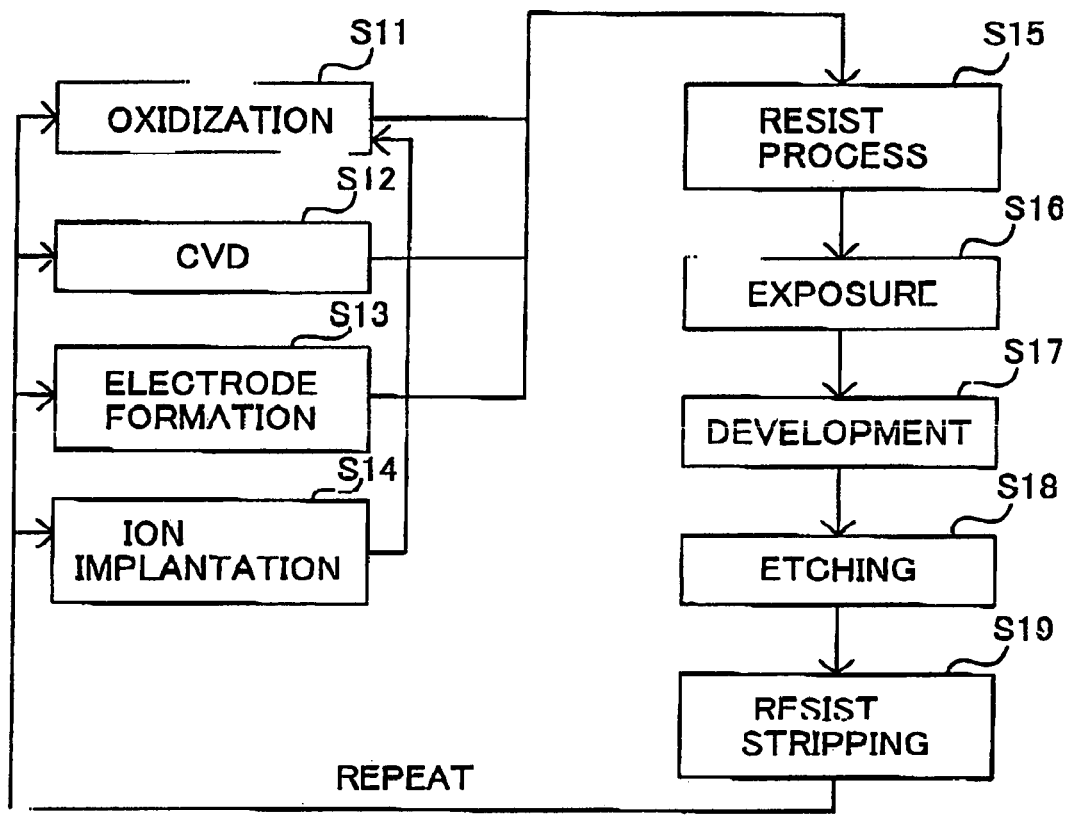
FIG. 19 is a detailed flowchart for Step 4 of wafer process shown in FIG. 18.
Figure 20:
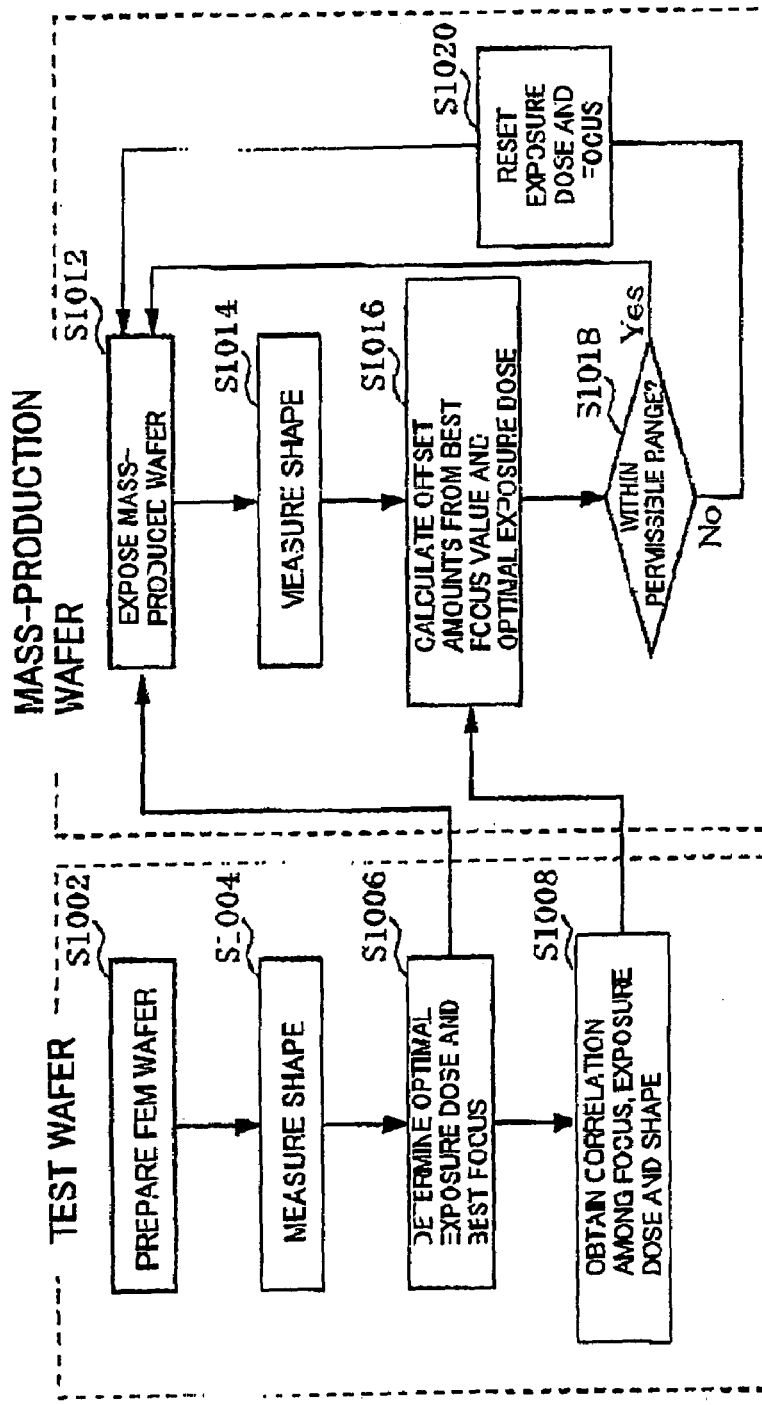
FIG. 20 is a flowchart for explaining a conventional method for setting the best exposure dose and the best focus.
Figure 21:
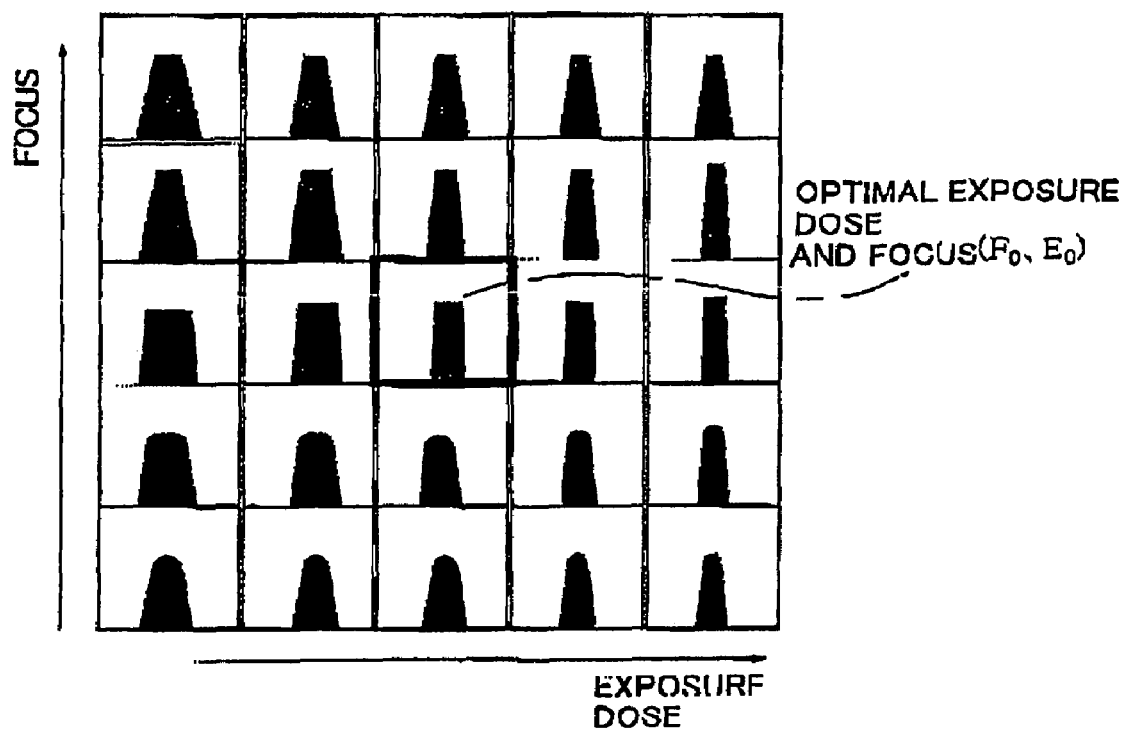
FIG. 21 is an enlarged sectional view of FEM pattern's sectional shapes at respective shots on a FEM wafer.

Referring to FIGS. 18 and 19, a description will now be given of an embodiment of device fabrication method using an exposure apparatus. FIG. 18 is a flowchart for explaining a fabrication of devices (i.e., semiconductor chips such as IC and LSI, LCDs, CCDs). A description will now be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography using the mask and wafer. Step 5 (assembly), which is also referred to as a posttreatment, forms into a semiconductor chip the ware formed in step 4 and includes a assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 19 is a detailed flowchart of the wafer process in Step 18. Step 11 (oxidation) oxidizes wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches part other than a developed resist image. Step 19 (resist stripping) removes disused resist after etching. These steps are repeated, and multi-layer circuit patterns are formed on the wafer. The fabrication method of the instant embodiment may manufacture higher quality devices than the prior art. Thus, the device fabrication method that utilizes the inventive exposure method, and devices as resultant products constitute one aspect of the present invention.

Further, the present invention is not limited to these preferred embodiments, and various variations and modifications may be made without departing from the spirit and scope of the present invention.

This application claims priority based on Japanese Patent Applications Nos. 2003-306293 filed on Aug. 29, 2003 and 2004-089539 filed Mar. 25, 2004, which is hereby incorporated by reference herein.

What is claimed is:

1. An exposure method for exposing a pattern on an original form onto an object through a projection optical system, said exposure method comprising the steps of:
    obtaining, for each piece of information of resist applied to a first object, a correlation among an exposure dose for exposing the first object, a focus state of the first object in the projection optical system, and a pattern shape formed on the first object exposed with the exposure dose and the focus state;
    acquiring information of resist applied to a second object different from the first object;
    determining an exposure dose for exposing the second object, and a focus state of the second object in the projection optical system, based on the correlation obtained for the first object by said obtaining step and the information of the resist applied to the second object acquired by said acquiring step; and
    transferring the pattern formed on the original form onto the second object in accordance with the exposure dose and focus state determined by said determining step.

2. An exposure method according to claim 1, wherein said obtaining step includes the steps of: acquiring the information of the resist applied onto the first object; and measuring a pattern shape formed on the first object.

3. An exposure method according to claim 1, wherein the information of the resist includes at least one of a refractive index, an absorption coefficient, a coating thickness of the resist, an application method of the resist, a pre-baking temperature and period of time for the wafer, a post exposure baking temperature and period of time for the wafer, the optical constants of a material of a primary coat in the wafer, and environments in which the developing apparatus and the semiconductor exposure apparatus are placed.

4. An exposure method according to claim 1, wherein said obtaining step obtains the correlation using a multivariate analysis.

5. An exposure method according to claim 1, wherein said obtaining step obtains the correlation using a relational equation derived from a N-th order polynomial or a neural net method.

6. An exposure method according to claim 5, wherein said obtaining step includes the step of measuring accuracy of the relational equation using a cross validation method.

7. An exposure method according to claim 1, wherein said acquiring step acquires the information of the resist by an ellipsometry or a spectroscopic ellipsometry.

8. An exposure method according to claim 1, wherein the pattern shape includes at least one of a line width, a height, a sidewall angle and a combination thereof.

9. A database used to determine an exposure dose and a focus state for an object to be exposed when an exposure apparatus exposes a pattern on an original form onto the object via the projection optical system using a first resist, said database in determining the exposure dose and the focus state for the object utilizes information of a second resist applied to another object separate from the object, a correlation among the exposure dose, focus state, and a pattern shape formed on the another object.

10. A device manufacturing method comprising the steps of:

exposing a wafer by the exposure method according to claim 1; and developing the wafer that has been exposed.

* * * * *